United States Patent
Jeon et al.

(10) Patent No.: US 11,778,741 B2
(45) Date of Patent: Oct. 3, 2023

(54) CIRCUIT BOARD

(71) Applicant: LG INNOTEK CO., LTD., Seoul (KR)

(72) Inventors: Yong Han Jeon, Seoul (KR); Jin Seok Lee, Seoul (KR); Tae Ki Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/906,166

(22) PCT Filed: Mar. 12, 2021

(86) PCT No.: PCT/KR2021/003116
§ 371 (c)(1),
(2) Date: Sep. 12, 2022

(87) PCT Pub. No.: WO2021/182920
PCT Pub. Date: Sep. 16, 2021

(65) Prior Publication Data
US 2023/0113302 A1   Apr. 13, 2023

(30) Foreign Application Priority Data

Mar. 12, 2020  (KR) ........................ 10-2020-0030596

(51) Int. Cl.
H05K 1/11 (2006.01)
(52) U.S. Cl.
CPC ....... H05K 1/113 (2013.01); *H05K 2201/099* (2013.01); *H05K 2201/09481* (2013.01);
(Continued)

(58) Field of Classification Search
CPC .............................................. H05K 1/11–119
See application file for complete search history.

(56) References Cited

U.S. PATENT DOCUMENTS

| 9,420,703 B2 | 8/2016 | Hayashi et al. |
| 2010/0252304 A1 | 10/2010 | Muramatsu et al. |
| 2015/0315708 A1 | 11/2015 | Radi et al. |

FOREIGN PATENT DOCUMENTS

| JP | 2010-245280 A | 10/2010 |
| KR | 10-2011-0059436 A | 6/2011 |

(Continued)

OTHER PUBLICATIONS

International Search Report dated Jul. 5, 2021 in International Application No. PCT/KR2021/003116.

*Primary Examiner* — Jeremy C Norris
(74) *Attorney, Agent, or Firm* — Saliwanchik, Lloyd & Eisenschenk

(57) ABSTRACT

A circuit board according to an embodiment includes an insulating layer; a circuit pattern disposed on an upper surface of the insulating layer; a first solder resist disposed on an upper surface of the insulating layer and having a height smaller than a height of the circuit pattern; and a second solder resist disposed on an upper surface of the first solder resist and including a first portion having an upper surface lower than an upper surface of the circuit pattern and a second portion having an upper surface higher than the upper surface of the circuit pattern, wherein the circuit pattern includes: a plurality of first circuit patterns disposed on an upper surface of a first region of the insulating layer, and a plurality of second circuit patterns disposed on an upper surface of a second region of the insulating layer; wherein the first portion of the second solder resist is disposed between the plurality of first circuit patterns to have an upper surface lower than an upper surface of the first circuit pattern; and wherein the second portion of the second solder resist has an upper surface higher than an upper surface of the second circuit pattern, and is disposed to cover (Continued)

the plurality of second circuit patterns between the plurality of second circuit patterns.

20 Claims, 16 Drawing Sheets

(52) U.S. Cl.
CPC .............. *H05K 2201/09618* (2013.01); *H05K 2201/10371* (2013.01); *H05K 2201/10931* (2013.01); *H05K 2201/10977* (2013.01)

(56) References Cited

FOREIGN PATENT DOCUMENTS

| | | |
|---|---|---|
| KR | 10-2014-0027731 A | 3/2014 |
| KR | 10-2016-0013007 A | 2/2016 |
| KR | 10-1596173 B1 | 2/2016 |
| KR | 10-2018-0013018 A | 2/2018 |

(a)

(b)

CIRCUIT BOARD

CROSS-REFERENCE TO RELATED APPLICATIONS

This application is the U.S. national stage application of International Patent Application No. PCT/KR2021/003116, filed Mar. 12, 2021, which claims the benefit under 35 U.S.C. § 119 of Korean Application No. 10-2020-0030596, filed Mar. 12, 2020, the disclosures of each of which are incorporated herein by reference in their entirety.

TECHNICAL FIELD

An embodiment relates to a circuit board, and more particularly, to a circuit board in which a circuit pattern of an outermost layer can be supported by using a solder resist.

BACKGROUND ART

A line width of circuits is becoming smaller as the miniaturization, weight reduction, and integration of electronic components accelerate. In particular, as design rules of semiconductor chips are integrated on a nanometer scale, a circuit line width of a package substrate or a circuit board on which a semiconductor chip is mounted is reduced to several micrometers or less.

In order to increase the degree of circuit integration of the circuit board, that is, various methods have been proposed in order to miniaturize the circuit line width. In order to inhibit loss of circuit line width in the etching step to form a pattern after copper plating, a semi-additive process (SAP) method and a modified semi-additive process (MSAP) have been proposed.

Thereafter, an Embedded Trace Substrate (hereinafter referred to as 'ETS') method in which copper foil is buried in an insulating layer to implement a finer circuit pattern has been used in the art. The ETS method is manufactured by embedding the copper foil circuit in the insulating layer instead of forming it on the surface of the insulating layer. For this reason, there is no circuit loss due to etching, so it is advantageous to refine the circuit pitch.

Meanwhile, recently, efforts are being made to develop an improved 5th generation (5G) communication system or a pre-5G communication system in order to meet the demand for wireless data traffic. Here, the 5G communication system uses ultra-high frequency (mmWave) bands (sub 6 gigabytes (6 GHz), 28 gigabytes 28 GHz, 38 gigabytes 38 GHz or higher frequencies) to achieve high data rates.

And, in order to alleviate the path loss of radio waves in the very high frequency band and increase the propagation distance of radio waves, aggregation technologies such as beamforming, massive MIMO, and array antenna are being developed in the 5G communication system. Considering that these frequency bands can consist of hundreds of active antennas of wavelengths, the antenna system becomes relatively large.

Since these antennas and AP modules are patterned or mounted on a circuit board, low loss of the circuit board is very important. This means that several substrates constituting the active antenna system, ie, an antenna substrate, an antenna feeding substrate, a transceiver substrate, and a baseband substrate, must be integrated into one compact unit.

And, the circuit board applied to the 5G communication system as described above is manufactured in the trend of light, thin and compact, accordingly, the circuit pattern is becoming more and more fine.

However, the conventional circuit board including a fine circuit pattern has a structure in which the outermost circuit pattern protrudes on the insulating layer, and accordingly, there is a problem in that the outermost circuit pattern easily collapses.

DISCLOSURE

Technical Problem

The embodiment provides a circuit board having a novel structure and a method of manufacturing the same.

In addition, the embodiment provides a circuit board capable of improving reliability by providing a structure including a solder resist capable of supporting a circuit pattern disposed at an outermost portion, and a method of manufacturing the same.

In addition, the embodiment provides a circuit board capable of providing a structure including a solder resist capable of supporting a circuit pattern disposed in a SR exposed region among circuit patterns disposed at the outermost portion, and a method of manufacturing the same.

In addition, the embodiment provides a circuit board capable of minimizing the occurrence of warpage of the circuit board by forming the solder resist in multiple layers in forming the solder resist for supporting the circuit pattern disposed at the outermost portion, and a method for manufacturing the same.

In addition, the embodiment provides a circuit board capable of improving the reliability of the substrate by including a plurality of solder resists having different material properties in forming a multilayer solder resist, and a method for manufacturing the same.

In addition, the embodiment provides a circuit board capable of solving a reliability problem that may be caused by a filler by removing the filler exposed through a surface of the solder resist, and a method for manufacturing the same.

The technical problem to be solved in the embodiment is not limited to the technical problem mentioned above, and another technical problem not mentioned will be clearly understood by those of ordinary skill in the art to which the present invention belongs from the following description.

Technical Solution

A circuit board according to an embodiment includes an insulating layer; a circuit pattern disposed on an upper surface of the insulating layer; a first solder resist disposed on an upper surface of the insulating layer and having a height smaller than a height of the circuit pattern; and a second solder resist disposed on an upper surface of the first solder resist and including a first portion having an upper surface lower than an upper surface of the circuit pattern and a second portion having an upper surface higher than the upper surface of the circuit pattern, wherein the circuit pattern includes: a plurality of first circuit patterns disposed on an upper surface of a first region of the insulating layer, and a plurality of second circuit patterns disposed on an upper surface of a second region of the insulating layer; wherein the first portion of the second solder resist is disposed between the plurality of first circuit patterns to have an upper surface lower than an upper surface of the first circuit pattern; and wherein the second portion of the second solder resist has an upper surface higher than an upper surface of the second circuit pattern, and is disposed to cover the plurality of second circuit patterns between the plurality of second circuit patterns.

In addition, the first region is a solder resist open region, and the second region is a solder resist placement region.

In addition, a material properties of the first solder resist are different from a material properties of the second solder resist.

In addition, a coefficient of thermal expansion of the first solder resist is smaller than a coefficient of thermal expansion of the second solder resist.

In addition, a filler content in the first solder resist is greater than a filler content in the second solder resist.

In addition, the filler content in the first solder resist is 50 wt % to 65 wt %, and the filler content in the second solder resist is 20 wt % to 35 wt %.

In addition, a height of an upper surface of the first solder resist satisfies 30% to 50% of a height of the upper surface of the first circuit pattern.

In addition, a height of the upper surface of the first portion of the second solder resist satisfies 70% to 90% of a height of the upper surface of the first circuit pattern.

In addition, the insulating layer includes a plurality of insulating layers, and wherein the first and second circuit patterns are disposed to protrude on an upper surface of an outermost insulating layer among the plurality of insulating layers.

In addition, the circuit board further includes a primer layer disposed between the upper surface of the insulating layer and the first solder resist, the first circuit pattern, and the second circuit pattern.

In addition, the first circuit pattern includes a trace and a pad, and the trace has a line width of 10 µm or less and an interval of 10 µm or less and are disposed on the upper surface of the first region.

On the other hand, a manufacturing method of the circuit board according to the embodiment includes: manufacturing an inner layer substrate; forming on the inner layer substrate, an uppermost insulating layer on which a primer layer is disposed on an upper surface of the uppermost insulating layer, forming a circuit pattern on the primer layer of the uppermost insulating layer, forming a first solder resist layer covering the circuit pattern on the primer layer; exposing and developing the first solder resist layer to form a first solder resist having a height smaller than a height of the circuit pattern; forming a second solder resist layer on the first solder resist; partially exposing and developing the second solder resist layer to form a second solder resist; wherein the forming the second solder resist includes forming the second resist including a first portion disposed on an upper surface of the first solder resist and having an upper surface lower than the upper surface of the circuit pattern, and a second portion having an upper surface higher than the upper surface of the circuit pattern, and wherein the first portion is disposed on a solder resist open region of an upper region of the uppermost insulating layer.

In addition, a material properties of the first solder resist layer are different from a material properties of the second solder resist layer.

In addition, a coefficient of thermal expansion of the first resist layer is smaller than a coefficient of thermal expansion the second solder resist layer.

In addition, a filler content in the first solder resist layer is greater than a filler content in the second solder resist layer.

In addition, the filler content in the first solder resist layer is 50 wt % to 65 wt %, and the filler content in the second solder resist layer is 20 wt % to 35 wt %.

In addition, the height of the upper surface of the first solder resist satisfies 30% to 50% of a height of the upper surface of the circuit pattern.

In addition, a height of the upper surface of the first portion of the second solder resist satisfies 70% to 90% of the height of the upper surface of the circuit pattern.

In addition, the circuit pattern includes a trace and a pad, wherein the traces are arranged with a line width of 10 µm or less and a space of 10 µm or less, a part of a side surface of the trace is in direct contact with a side surface of the second portion of the second solder resist, and the remaining part of the side surface of the trace is exposed to an outside.

Advantageous Effects

The circuit board in this embodiment is a circuit board having a multilayer structure of 8 or more layers, and includes an outer layer circuit pattern disposed on an uppermost outer insulating layer of the multilayers and protruding from the surface of the outer insulating layer. In this case, the outer layer circuit pattern includes a second-first circuit pattern disposed in a second region in which a solder resist (SR) is disposed among an upper region of the outer insulating layer, and a second-second circuit pattern disposed in a first region that is an open region where the solder resist is not disposed. In this case, the second-first circuit pattern may be supported by being surrounded by the solder resist, but since the second-second circuit pattern does not have a support layer capable of supporting the second-first circuit pattern, it may easily collapse due to various factors.

Accordingly, a support layer capable of supporting the second-second circuit pattern in the embodiment is formed on the first insulating layer corresponding to the outer insulating layer. In this case, the support layer in the embodiment may be implemented with a solder resist having a multilayer structure. Preferably, the multilayer solder resist of the embodiment is disposed between a plurality of second-second circuit patterns while covering the second-first circuit pattern and exposing the second-second circuit pattern.

Accordingly, the embodiment can solve problems such as collapsing or abrasion of the protruded outer layer circuit pattern by miniaturization of the outer layer circuit pattern, and thus product reliability can be improved. In particular, the embodiment can solve problems such as collapsing or rubbing of the outer layer circuit pattern in the first region, thereby improving product reliability.

In this case, the solder resist of the embodiment may include a first solder resist and a second solder resist. In addition, the first solder resist may be disposed in the first region and the second region to have a height lower than that of the second-second circuit pattern. Preferably, an upper surface of the first solder resist may be positioned lower than an upper surface of the second circuit pattern in the first region and the second region. In addition, the second solder resist is disposed on the first solder resist, and thus may have different heights for each region. That is, an upper surface of the second solder resist in the first region is disposed to have a lower height than upper surfaces of the second-first and second-second circuit patterns, and an upper surface of the second solder resist in the second region may be disposed to have a higher height than upper surfaces of the second-first and second-second circuit patterns. In this case, the first solder resist and the second solder resist may have different material properties. Preferably, the first solder resist may include a material having a high filler content while having a lower CTE compared to the second solder resist.

Accordingly, the embodiment can minimize the occurrence of warpage of the circuit board by allowing the function of alleviating CTE in the laminated structure of the circuit board by applying first and second solder resists with different CTEs. In addition, the embodiment can inhibit in advance a situation in which the filler remains on the surface of the second-second circuit pattern by the second solder resist having a lower filler content than the first solder resist, and thus reliability can be improved.

In addition, when removing the first and second solder resists of the embodiment, they are removed using an exposure and development method rather than a sand blast or plasma method. At this time, when removing the solder resist using a sandblasting or plasma method, the outer layer circuit pattern may be deformed, and in some cases, a cross-section of the outer layer circuit pattern may have a triangular shape. And, when the cross section of the outer layer circuit pattern has a triangle, an adhesive member may not be stably disposed on the outer layer circuit pattern, and thus a reliability problem may occur. In contrast, the first and second solder resists in the embodiment may be removed without deformation of the outer layer circuit pattern, and thus reliability may be improved.

In addition, the circuit board of the embodiment can be applied to a 5G communication system, and thus, it is possible to further improve reliability by minimizing transmission loss at high frequencies. Specifically, the circuit board in the embodiment can be used at a high frequency and can reduce propagation loss.

MODES OF THE INVENTION

Figure 1A:
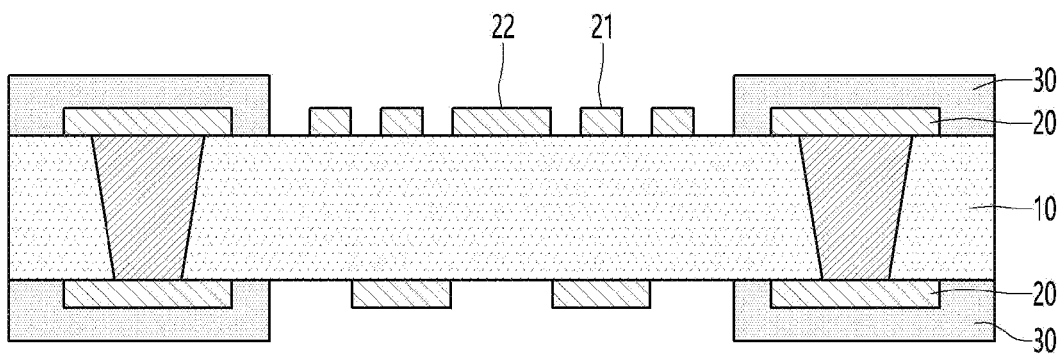
FIGS. 1a and 1b are views showing a circuit board manufactured by an SAP method according to a comparative example.

Hereinafter, embodiments disclosed in the present specification will be described in detail with reference to the accompanying drawings, but identical or similar elements are denoted by the same reference numerals regardless of reference numerals, and redundant descriptions thereof will be omitted. The suffixes "module" and "portion" for the components used in the following description are given or used interchangeably in consideration of only the ease of writing the specification, and do not have meanings or roles that are distinguished from each other by themselves. In addition, in describing the embodiments disclosed in the present specification, if it is determined that a detailed description of related known technologies may obscure the subject matter of the embodiments disclosed in the present specification, the detailed description thereof will be omitted. In addition, the accompanying drawings are only for making it easier to understand the embodiments disclosed in the present specification, and the technical idea disclosed in the present specification is not limited by the accompanying drawings, and this should be understood to include all changes, equivalents, or substitutes included in the spirit and scope of the present invention.

Terms including ordinal numbers such as first and second may be used to describe various elements, but the elements are not limited by the terms. The above terms are used only for the purpose of distinguishing one component from another component.

When a component is referred to as being "contacted" or "connected" to another component, it may be directly connected or connected to the other component, but other components may exist in the middle. On the other hand, when a component is referred to as being "directly contacted" or "directly connected" to another component, it should be understood that there is no other component in the middle.

Singular expressions include plural expressions unless the context clearly indicates otherwise.

In the present application, terms such as "comprises" or "have" are intended to designate the presence of features, numbers, steps, actions, components, parts, or combinations thereof described in the specification, but one or more other features. It is to be understood that the presence or addition of elements or numbers, steps, actions, components, parts, or combinations thereof, does not preclude in advance the possibility of being excluded.

Hereinafter, exemplary embodiments of the present invention will be described in detail with reference to the accompanying drawings.

Before describing a present embodiment, a comparative example compared with the present embodiment will be described.

Figure 1B:
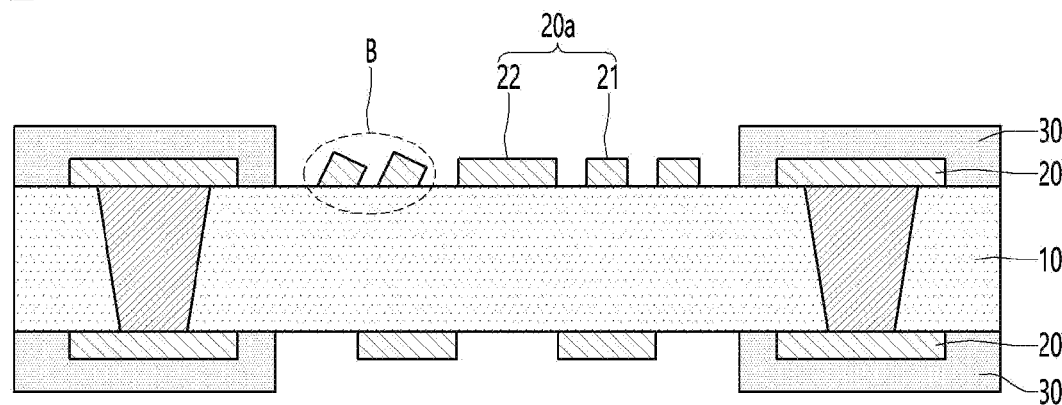

FIGS. 1a and 1b are views showing a circuit board according to a comparative example. Referring to FIG. 1a, a circuit board according to a comparative example includes a circuit pattern manufactured by a general SAP method.

Specifically, the circuit board includes an insulating layer 10, a circuit pattern 20, and a protective layer 30.

The circuit pattern 20 is disposed on upper and lower surfaces of the insulating layer 10, respectively.

In this case, at least one of the circuit patterns 20 disposed on the surface of the insulating layer 10 includes a fine circuit pattern.

Referring to FIGS. 1a and 1b, the circuit pattern 20 disposed on the upper surface of the insulating layer 10 includes a fine circuit pattern. The fine circuit pattern includes a trace 21 which is a signal transmission wiring line, and a pad 22 for chip mounting and the like.

At this time, the embodiment forms a support layer using a solder resist for the purpose of protecting the fine circuit pattern, and accordingly, in the comparative example, the structure in the region where the fine circuit pattern is formed will be described.

In addition, a protective layer 30 for protecting the circuit pattern 20 is disposed on the surface of the insulating layer 10.

In this case, an upper region of the insulating layer 10 includes a first region in which the protective layer 30 is disposed and a second region that is an open region in which the protective layer 30 is not disposed.

Accordingly, a part of the circuit pattern 20 disposed on the upper surface of the insulating layer 10 is covered by the protective layer 30, and the remaining part is exposed to an outside without being covered by the protective layer 30.

In this case, the trace 21 and the pad 22 corresponding to the fine circuit pattern as described above are disposed in the second region that is the open region of the protective layer 30.

For example, at least one of the trace 21 and the pad 22 has a width/interval of 15 µm/15 µm or less.

In this case, when the circuit pattern formed in the open region of the protective layer 30 is a pattern having a width exceeding 15 µm rather than a fine circuit pattern, it may be strong against external impact.

However, as shown in FIG. 1b, the width and interval of the trace 21 and the pad 22, which are the fine circuit patterns of an outermost layer, are getting smaller as the circuit pattern is gradually refined, the fine circuit pattern easily collapses due to an external impact when the fine circuit pattern protruding one the upper surface of the insulating layer 10 is disposed in the second region that is the open region of the protective layer.

That is, as in B of FIG. 1B, the trace 21 corresponding to the fine circuit pattern of the outermost layer has an extremely fine pattern shape, and thus it can easily collapse or be swept away by a small external impact.

On the other hand, recently, a fine circuit pattern disposed in an open region of the protective layer while having a structure buried in the insulating layer is formed using the ETS method.

Figure 2:
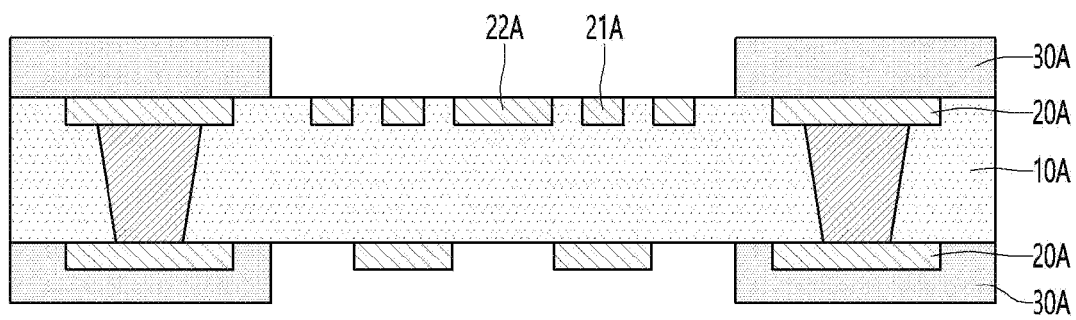
FIG. 2 is a view showing a circuit board manufactured by an ETS method in a comparative example.

FIG. 2 is a view showing a circuit board manufactured by an ETS method in a comparative example.

Referring to FIG. 2, specifically, the circuit board includes an insulating layer 10A, a circuit pattern 20A, and a protective layer 30A.

The circuit pattern 20A is disposed on upper and lower surfaces of the insulating layer 10A, respectively.

In this case, at least one of the circuit patterns 20A disposed on the surface of the insulating layer 10A includes a fine circuit pattern.

Here, when the circuit pattern is formed by the ETS method, the first circuit pattern formed has a structure buried in the insulating layer 10A. Accordingly, when an initially formed circuit pattern is formed as a fine circuit pattern, the fine circuit pattern may have a structure in which the fine circuit pattern is buried in the insulating layer 10A even in the comparative example.

That is, the circuit board manufactured by the ETS method includes a fine circuit pattern having a structure buried in the surface of the insulating layer 10A. That is, the fine circuit pattern includes a trace 21A, which is a signal transmission wiring line, and a pad 22A for mounting a chip or the like.

And, when the circuit board is manufactured by the ETS method as described above, the fine circuit pattern can be protected from external impact, and because the fine circuit pattern has a structure buried in the insulating layer.

At this time, as in FIG. 2, when a substrate having a two-layer structure (based on the number of layers of a circuit pattern) is manufactured by the ETS method, there is no major problem. However, when manufacturing a circuit board having 8 or more layers, especially 10 layers or more, using the ETS method, the lead time for manufacturing it is at least 2 months or more, and accordingly, there is a problem in that productivity decreases.

In addition, the fine circuit pattern must firstly be formed during the manufacturing process of the multilayer circuit board in order to manufacture the fine circuit pattern of the buried structure by the ETS method. And, the circuit board of 8 to 10 layers are required in order to be applied to an AP module of recent high integration/high specification, etc. At this time, when the subsequent multilayer lamination process is performed in the state in which the fine circuit pattern is first formed during the ETS process, damage is applied to the fine circuit pattern due to thermal stress or the like, and accordingly, there is a problem in that it is difficult to normally implement the fine circuit pattern.

In addition, when the circuit board is manufactured by the ETS method, an ETS core layer is separately required. In this case, when the circuit board is manufactured by the ETS method, an additional process for finally removing the ETS core layer is required.

In addition, when manufacturing a circuit board by the ETS method, yield is reduced due to cumulative tolerance due to layer laminating more than a certain number of times, and accordingly, there is a problem in that the product cost increases. In addition, there is a problem in that pattern damage increases due to the stress caused by the lamination process being performed on both sides of the ETS core layer.

In addition, recently, interest in circuit boards that can reflect the development of 5G technology is increasing. At this time, in order to apply the 5G technology, the circuit board must have a high multi-layer structure, and accordingly the circuit pattern must be miniaturized. However, although it is possible to form a fine pattern in the comparative example, there is a problem in that it cannot be stably protected.

Accordingly, the embodiment provides a circuit board having a new structure capable of solving the reliability problem of an outermost fine pattern and a method for controlling the same.

Figure 3:
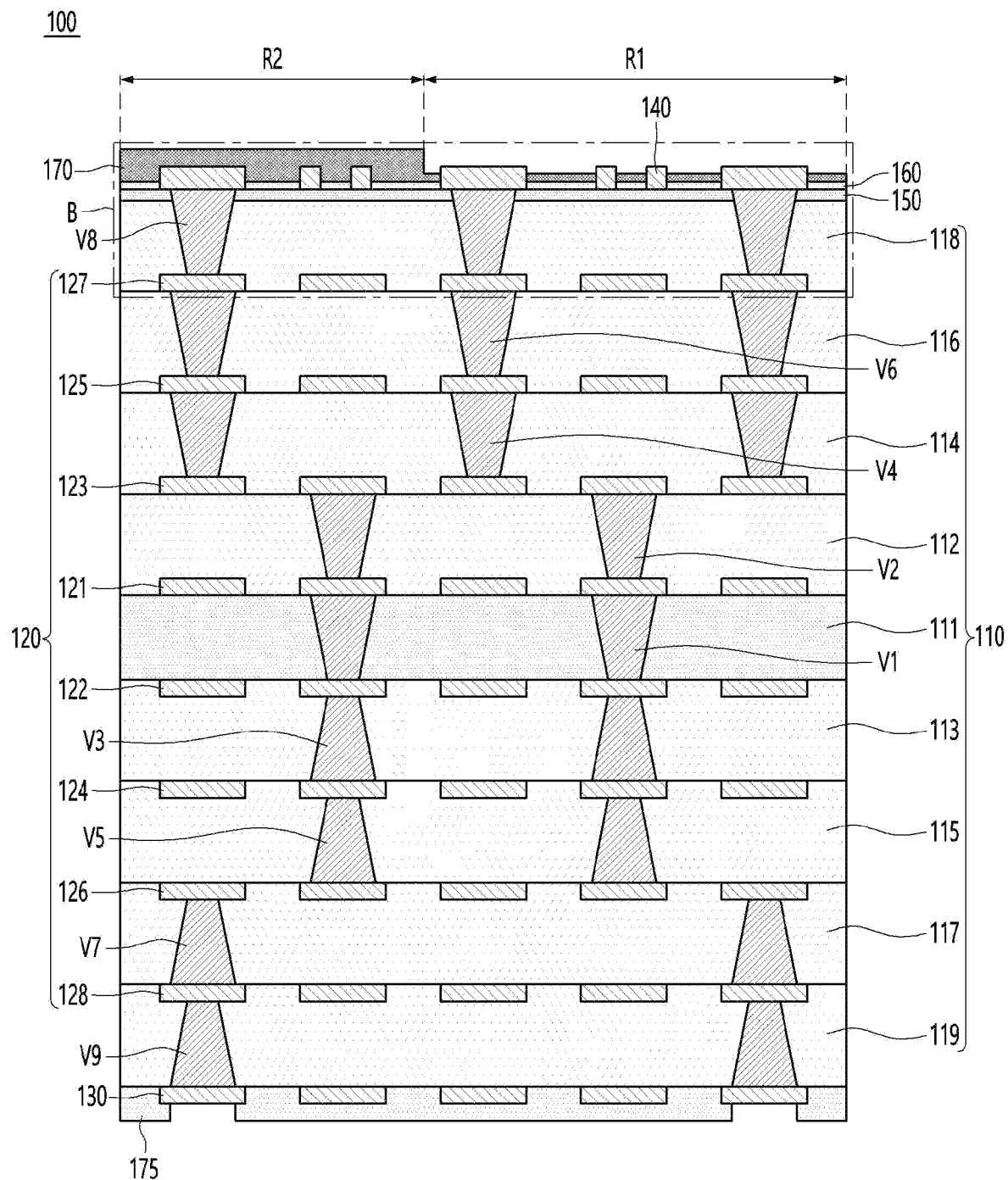
FIG. 3 is a view showing a circuit board according to an embodiment.
Figure 4:
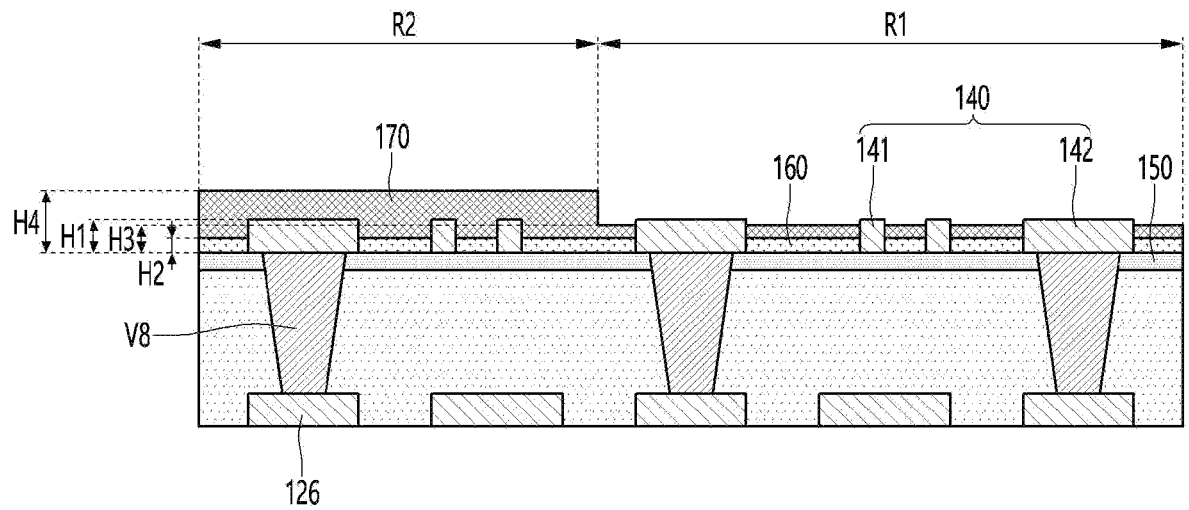
FIG. 4 is an enlarged view of region B of FIG. 3.

FIG. 3 is a view showing a circuit board according to an embodiment, and FIG. 4 is an enlarged view of region B of FIG. 3.

Before describing FIGS. 3 and 4, the circuit board according to the embodiment may have a multilayer structure. Preferably, the circuit board according to the embodiment may have a structure of 10 or more layers based on the number of layers of the circuit pattern. However, this is only an example, and is not limited thereto. That is, the circuit board according to the embodiment may have a number of layers smaller than 10 layers, or alternatively, may have a number of layers larger than 10 layers.

However, the circuit board in the embodiment is for solving the problem of the ETS method of the comparative example. At this time, the ETS method in the comparative example has many problems in manufacturing a circuit board with 8 or more layers, and accordingly, the embodiment will be described as having a 10-layer structure for comparison.

FIGS. 3 and 4, the circuit board 100 includes an insulating layer 110.

Preferably, the circuit board 100 may include first to ninth insulating layers 111, 112, 113, 114, 115, 116, 117, 118, and 119 to implement a 10-layer structure.

In this case, the first insulating layer 111, the second insulating layer 112, the third insulating layer 113, the fourth insulating layer 114, the fifth insulating layer 115, and the sixth insulating layer 116 and the seventh insulating layer 117 may be internal insulating layers disposed at an inside in the laminated structure of insulating layers, the eighth insulating layer 118 may be an uppermost insulating layer (first outermost insulating layer) disposed on an upper portion of the inner insulating layer, and the ninth insulating layer 119 may be a lowermost insulating layer (a second outermost insulating layer) disposed below a lower portion of the inner insulating layer.

The first insulating layer 111 may be a core insulating layer disposed at a center in the laminated structure of the insulating layer 110. The second insulating layer 112, the fourth insulating layer 114, the sixth insulating layer 116, and the eighth insulating layer 118 may be an upper insulating layer sequentially disposed on the first insulating layer 111. In addition, the third insulating layer 113, the fifth insulating layer 115, the seventh insulating layer 117, and the ninth insulating layer 119 may be a lower insulating layer sequentially disposed under the first insulating layer 111.

The insulating layer 110 is a substrate on which an electric circuit capable of changing wiring is formed, and may include all of a printed circuit board and an insulating substrate made of an insulating material capable of forming circuit patterns on the surface thereof.

For example, at least of the insulating layer 110 may be rigid or may be flexible. For example, at least of the insulating layer 110 may include glass or plastic. In detail, at least of the insulating layer 110 may include chemically strengthened/semi-tempered glass such as soda lime glass or aluminosilicate glass, or strengthened or flexible plastic such as polyimide (PI), polyethylene terephthalate (PET), propylene glycol (PPG) and polycarbonate (PC), or sapphire.

In addition, at least of the insulating layer 110 may include an optical isotropic film. For example, at least one of the first insulating layer 111, the second insulating layer 112, at least of the insulating layer 110 may be includes COC (cyclic Olefin Copolymer), COP (Cyclic Olefin Polymer), photo isotropic polycarbonate (polycarbonate, PC), or photo isotropic polymethyl methacrylate (PMMA).

In addition, at least of the insulating layer 110 may be bent while having a partially curved surface. That is, at least of the insulating layer 110 may be bent while having a partially flat surface and a partially curved surface. In detail, at least of the insulating layer 110 may have a curved end while having a curved surface, or may have a surface including a random curvature and may be bent or curved.

In addition, at least of the insulating layer 110 may be a flexible substrate having a flexible characteristic. Also, at least of the insulating layer 110 may be a curved or bent substrate. At this time, at least one of the insulating layer 110 may represent an electrical wiring connecting circuit components based on a circuit design as a wiring diagram, and an electrical conductor may be reproduced on the insulating material. In addition, at least one of the insulating layers 110 may form a wiring for mounting electrical components and circuitry connecting them, and may mechanically fix components other than the electrical connection function of the components.

A circuit pattern may be disposed on a surface of the insulating layer 110.

That is, circuit patterns may be disposed on respective surfaces of the first to ninth insulating layers 111, 112, 113, 114, 115, 116, 117, 118, and 119 constituting the insulating layer 110.

Here, the circuit pattern may include an inner layer circuit pattern 120 and outer layer circuit patterns 130 and 140. The inner layer circuit pattern 120 may be a circuit pattern disposed at an inside the insulating layer 110 in the laminated structure of the circuit board, and the outer layer circuit patterns 130 and 140 may be circuit patterns disposed at an outermost side of the insulating layer 110 in the laminated structure of the circuit board.

The inner layer circuit pattern 120 may include a first circuit pattern 121, a second circuit pattern 122, a third circuit pattern 123, a fourth circuit pattern 124, a fifth circuit pattern 125, and a sixth circuit pattern 126 and a seventh circuit pattern 127.

The first circuit pattern 121 may be disposed on an upper surface of the first insulating layer 111, and thus may be covered by the second insulating layer 112. The second circuit pattern 122 may be disposed on a lower surface of the first insulating layer 111, and thus may be covered by the third insulating layer 113. The third circuit pattern 123 may be disposed on an upper surface of the second insulating layer 112, and thus may be covered by the fourth insulating layer 114. The fourth circuit pattern 124 may be disposed on a lower surface of the third insulating layer 113, and thus may be covered by the fifth insulating layer 115. The fifth circuit pattern 125 may be disposed on an upper surface of the fourth insulating layer 114, and thus may be covered by the sixth insulating layer 116. The sixth circuit pattern 126 may be disposed on a lower surface of the fifth insulating layer 115, and thus may be covered by the seventh insulating layer 117. The seventh circuit pattern 127 may be disposed on an upper surface of the sixth insulating layer 116, and thus may be covered by the eighth insulating layer 118. The eighth circuit pattern 128 may be disposed on a lower surface of the seventh insulating layer 117, and thus may be covered by the ninth insulating layer.

The outer circuit pattern may be disposed on a surface of an outermost insulating layer disposed at an outermost portion of the insulating layer 110. Preferably, the outer circuit pattern may include the first outer circuit pattern 130 disposed on a lower surface of the ninth insulating layer 119 disposed at the lowermost portion of the insulating layer 110.

In addition, the outer layer circuit pattern may include a second outer layer circuit pattern 140 disposed on an upper surface of the eighth insulating layer 118 disposed at an uppermost portion of the insulating layer 110.

In this case, at least one of the first outer layer circuit pattern 130 and the second outer layer circuit pattern 140 may be formed to protrude from the surface of the insulating layer. Preferably, the first outer circuit pattern 130 may be formed to protrude below the lower surface of the ninth insulating layer 119. In addition, the second outer layer circuit pattern 140 may be formed to protrude above the upper surface of the eighth insulating layer 118.

That is, the upper surface of the first outer layer circuit pattern 130 may be positioned on the same plane as the lower surface of the ninth insulating layer 119. In addition, the second outer layer circuit pattern 140 may have a lower surface positioned on the same plane as the upper surface of the primer layer 150 disposed on the upper surface of the eighth insulating layer 180.

In other words, a primer layer 150 may be disposed on the upper surface of the eighth insulating layer 180 and the second outer layer circuit pattern 140.

That is, the second outer layer circuit pattern 140 may include a fine circuit pattern. Preferably, the second outer layer circuit pattern 140 may be a fine circuit pattern having a line width of 10 μm or less and an interval between the patterns of 10 μm or less. Accordingly, when the second outer circuit pattern 140 is directly disposed on the eighth insulating layer 118, a contact area between the eighth insulating layer 118 and the second outer circuit pattern 140 is small, and whereby a situation in which the second outer layer circuit pattern 150 is separated from the eighth insulating layer 118 may occur.

Accordingly, the primer layer 150 in the embodiment is disposed between the second outer layer circuit pattern 140 and the eighth insulating layer 118. The primer layer 150 may improve adhesion between the second outer layer circuit pattern 140 and the eighth insulating layer 118. The primer layer 150 may be disposed to completely cover the upper surface of the eighth insulating layer 118. In addition, the second outer layer circuit pattern 140 may be partially disposed on the primer layer 150. Accordingly, an upper surface of the primer layer 150 in the embodiment may include a first portion in contact with the second outer layer circuit pattern 140 and a second portion in contact with a lower surface of a first solder resist 160 to be described later. That is, when forming the second outer layer circuit pattern 140 by the SAP process, the primer layer 150 may serve to strengthen the bonding force between the eighth insulating layer 118 and the second outer layer circuit pattern 140. Such a primer layer 150 may include a polyurethane-based resin, an acrylic resin, or a silicone-based resin, but is not limited thereto.

Meanwhile, in FIG. 3, it is illustrated that the primer layer is not disposed between the ninth insulating layer 119 and the first outer layer circuit pattern 130, the primer layer may also be disposed between the ninth insulating layer 119 and the first outer layer circuit pattern 130. However, the first outer layer circuit pattern 130 may not be a fine circuit pattern, and accordingly, the primer layer between the ninth insulating layer 119 and the first outer circuit pattern 130 may be selectively omitted.

Consequently, when the fine circuit pattern is disposed on the inner layer, the primer layer may be omitted as it is covered by at least one of the insulating layers 110. On the other hand, when the fine circuit pattern in the embodiment is disposed on the outermost layer, there is no insulating layer covering the fine circuit pattern, and the primer layer 150 may be disposed to improve bonding strength between the fine circuit pattern and the insulating layer.

Hereinafter, it will be described that the second outer layer circuit pattern 140 is formed as a fine circuit pattern. However, the embodiment is not limited thereto, and the first outer layer circuit pattern 130 may also be formed as a fine circuit pattern. Accordingly, it will be apparent that a structure for improving reliability, such as strengthening the bonding strength of the second outer layer circuit pattern 140 and inhibiting collapsing, which will be described below, can also be applied to the first outer layer circuit pattern 130.

Meanwhile, the inner layer circuit pattern 120, the first outer layer circuit pattern 130, and the second outer layer circuit pattern 140 are a wire that transmits an electrical signal, and may be formed of a metal material having high electrical conductivity. To this end, the inner layer circuit pattern 120, the first outer layer circuit pattern 130, and the second outer layer circuit pattern 140 may be formed of at least one metal material selected from gold (Au), silver (Ag), platinum (Pt), titanium (Ti), tin (Sn), copper (Cu), and zinc (Zn). In addition, the circuit pattern 120 may be formed of a paste or solder paste including at least one metal material selected from gold (Au), silver (Ag), platinum (Pt), titanium (Ti), tin (Sn), copper (Cu), and zinc (Zn) having excellent bonding power. Preferably, the inner layer circuit pattern 120, the first outer layer circuit pattern 130, and the second outer layer circuit pattern 140 may be formed of copper (Cu) having high electrical conductivity and a relatively inexpensive price.

The inner layer circuit pattern 120, the first outer layer circuit pattern 130, and the second outer layer circuit pattern 140 may be formed by an additive process, a subtractive process, a modified semi additive process (MSAP), and a semi additive process (SAP) process, which are typical circuit board manufacturing processes. and a detailed description thereof will be omitted here.

Preferably, the first outer layer circuit pattern 130 and the second outer layer circuit pattern 140 are outermost circuit patterns disposed on the outermost side of the circuit board, and thus they may be formed by the SAP (Semi Additive Process) method.

Meanwhile, a via V may be disposed in the insulating layer 110. The vias V are disposed in each insulating layer, and thus may serve to electrically connect circuit patterns disposed in different layers to each other.

A first via V1 may be disposed in the first insulating layer 111. The first via V1 may electrically connected the first circuit pattern 121 disposed on the upper surface of the first insulating layer 111 and the second circuit pattern 122 disposed on the lower surface of the first insulating layer 111.

A second via V2 may be disposed in the second insulating layer 112. The second via V2 may be electrically connected between the first circuit pattern 121 disposed on the upper surface of the first insulating layer 111 and the third circuit pattern 123 disposed on the upper surface of the second insulating layer 112.

A third via V3 may be disposed in the third insulating layer 113. The third via V3 may be electrically connected the second circuit pattern 122 disposed on the lower surface of the first insulating layer 111 and the fourth circuit pattern 124 disposed on the lower surface of the third insulating layer 113.

A fourth via V4 may be disposed in the fourth insulating layer 114. The fourth via V4 may be electrically connected the third circuit pattern 123 disposed on the upper surface of the second insulating layer 111 and the fifth circuit pattern 125 disposed on the upper surface of the fourth insulating layer 114.

A fifth via V5 may be disposed in the fifth insulating layer 115. The fifth via V5 may be electrically connected the fourth circuit pattern 124 disposed on the lower surface of the third insulating layer 113 and the sixth circuit pattern 126 disposed on the lower surface of the fifth insulating layer 115.

A sixth via V6 may be disposed in the sixth insulating layer 116. The sixth via V6 may be electrically connected the fifth circuit pattern 125 disposed on the upper surface of the fourth insulating layer 114 and the seventh circuit pattern 127 disposed on the upper surface of the sixth insulating layer 116.

A seventh via V7 may be disposed in the seventh insulating layer 117. The seventh via V7 may be electrically connected the sixth circuit pattern 126 disposed on the lower surface of the fifth insulating layer 115 and the eighth circuit pattern 128 disposed on the lower surface of the seventh insulating layer 117.

An eighth via V1 may be disposed in the eighth insulating layer 118. The eighth via V8 may be electrically connected the seventh circuit pattern 127 disposed on the upper surface of the sixth insulating layer 116 and the second outer layer circuit pattern 140 disposed on the upper surface of the primer layer 150.

A ninth via V9 may be disposed in the ninth insulating layer 119. The ninth via V9 may be electrically connected the eighth circuit pattern 128 disposed on the lower surface of the seventh insulating layer 117 and the first outer circuit pattern 130 disposed on the lower surface of the ninth insulating layer 119.

The via V may be formed by filling an inside of a via hole (not shown) formed in each insulating layer with a conductive material.

The via hole may be formed by any one of mechanical, laser, and chemical processing. When the through hole is formed by machining, methods such as milling, drilling, and routing may be used, and when formed by laser processing, a UV or CO2 laser method may be used. In addition, when formed by chemical processing, a chemical containing aminosilane, ketones, or the like may be used. Accordingly, at least one of plurality of insulating layers may be opened.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a CO2 laser, or an ultraviolet (UV) laser. YAG laser is a laser that can process both copper foil layers and insulating layers, and CO2 laser is a laser that can process only insulating layers.

When the through hole is formed, the first to ninth via V1, V2, V3, V4, V5, V6, V7, V8 and V9 may be formed by filling the inside of the through hole with a conductive material. The metal material forming the first to ninth via V1, V2, V3, V4, V5, V6, V7, V8 and V9 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, inkjetting and dispensing.

Meanwhile, a protective layer may be disposed on an outermost side of the circuit board 100. Preferably, the first protective layers 160 and 170 may be disposed on the eighth insulating layer 118 (preferably, on the primer layer 150). In addition, a second protective layer 175 may be disposed under the ninth insulating layer 119.

The first protective layers 160 and 170 and the second protective layer 175 may be formed of at least one layer using any one or more of Solder Resist (SR), oxide, and Au. Preferably, the first protective layers 160 and 170 and the second protective layer 175 may be solder resist.

Meanwhile, first protective layers 160 and 170 are disposed on the primer layer 150. The first protective layers 160 and 170 may serve to support the second outer layer circuit pattern 140 disposed on the primer layer 150.

That is, the first protective layers 160 and 170 may partially overlap the second outer layer circuit pattern 140 disposed on the primer layer 150. An area of the first protective layers 160 and 170 may be smaller than an area of the eighth insulating layer 118. An area of the first protective layers 160 and 170 may be smaller than an area of the primer layer 150. The first protective layers 160 and 170 are partially or entirely disposed on the primer layer 150 and the second outer layer circuit pattern 140, and accordingly, the first protective layer may include an open region exposing the surface of the second outer layer circuit pattern 140.

The first protective layers 160 and 170 may include an open region or a first region R1 having a groove-like shape. The first region R1 may mean a region in which the surface of the second outer layer circuit pattern 140 is exposed through the first protective layers 160 and 170 among the upper region of the primer layer 150 and the second outer layer circuit pattern 140.

That is, the circuit board includes a first region R1 and a second region R2. The first region R1 is an open region in which the surface of the second outer layer circuit pattern 140 must be exposed through the first protective layers 160 and 170, and the second region R2 may be a buried region in which the surface of the second outer layer circuit pattern 140 is covered by the first passivation layers 160 and 170.

That is, the first region R1 may be a non-arranged region of the first protective layers 160 and 170 for electrically connecting the second outer layer circuit pattern 140 to a component such as a chip. Accordingly, the second outer layer circuit pattern 140 disposed on the first region R1 may be exposed to the outside in a state in which a protective layer protecting the second outer layer circuit pattern 140 does not exist.

In addition, the second outer layer circuit pattern 140 disposed in the first region R1 as described above may have reliability problems such as collapsing or rubbing due to various factors. Furthermore, the second outer layer circuit pattern 140 is a fine circuit pattern, and thus has a line width of 10 μm or less and an interval of 10 μm or less, and is disposed on the primer layer 150. Accordingly, the second outer layer circuit pattern 140 disposed on the first region R1 may easily collapse or rub against various small external impacts.

Accordingly, the first protective layers 160 and 170 in the embodiment are also disposed on the primer layer 150 corresponding to the first region R1 in order to improve the reliability of the second outer layer circuit pattern 140 disposed on the first region R1.

That is, the first protective layers 160 and 170 may be disposed on the upper surface of the primer layer 150 in a region where the second outer layer circuit pattern 140 is not disposed. For example, the first protective layers 160 and 170 are disposed on the upper surface of the primer layer 150, and thus may be disposed between the second outer layer circuit patterns 140 on the first region R1.

In this case, the second outer layer circuit pattern 140 includes a second-first outer layer circuit pattern formed in the first region R1 and a second-second outer layer circuit pattern formed in the second region R2.

The upper surface of the primer layer 150 includes a first upper surface corresponding to the first region R1 and a second upper surface corresponding to the second region R2.

At this time, as shown in FIGS. 3 and 4, the first protective layers 160 and 170 are disposed entirely on the primer layer 150 without dividing the first region R1 and the second region R2, and may be disposed in a region between the second-first outer layer circuit patterns and a region between the second-second outer layer circuit patterns, respectively.

Accordingly, the first protective layers 160 and 170 include a first portion disposed in the first region R1 and a second portion disposed in the second region R2.

In this case, the first protective layers 160 and 170 may have different heights for each region.

For example, the first protective layers 160 and 170 may include a first portion disposed in the first region R1 and a second portion disposed in the second region R2.

At this time, the surface of the second outer layer circuit pattern 140 in the first region R1 should be exposed to the outside, and the surface of the second outer layer circuit pattern 140 in the second region R2 should be covered by a protective layer.

Accordingly, an upper surface of the first portion of the first protective layers 160 and 170 disposed in the first region R1 may be lower than an upper surface of the second outer layer circuit pattern 140. Preferably, the height or thickness of the first portion of the first protective layers 160 and 170 may be smaller than the height or thickness of the second outer layer circuit pattern 140.

Also, an upper surface of the second portion of the first protective layers 160 and 170 disposed in the second region R2 may be positioned higher than an upper surface of the second outer layer circuit pattern 140. Preferably, the height or thickness of the second portion of the first protective layers 160 and 170 may be greater than the height or thickness of the second outer layer circuit pattern 140.

Accordingly, the surface of the second outer layer circuit pattern 140 disposed in the first region R1 may be exposed to the outside due to a low height of the first protective layers 160 and 170, and the second outer layer circuit pattern 140 disposed in the second region R2 may be buried in the first protective layers 160 and 170 due to a high height of the first protective layers 160 and 170.

Hereinafter, the first protective layers 160 and 170 will be described in detail.

The first protective layers 160 and 170 may be disposed on the primer layer 150. Preferably, the first protective layers 160 and 170 may be disposed between the second outer layer circuit patterns 140 on the primer layer 150. That is, the second outer layer circuit pattern 140 may be disposed to be spaced apart from each other at a predetermined interval on the primer layer 150, and accordingly, the first protective layers 160 and 170 may be disposed on a region of the upper surface of the primer layer 150 where the second outer layer circuit pattern 140 is not disposed.

Preferably, the first protective layers 160 and 170 may include a first solder resist 160 and a second solder resist 170.

In addition, the first solder resist 160 may be disposed on a region of the upper surface of the primer layer 150 where the second outer layer circuit pattern 140 is not disposed.

Accordingly, the lower surface of the first solder resist 160 may directly contact the upper surface of the primer layer 150. Also, a side surface of the first solder resist 160 may have a structure in direct contact with the second outer layer circuit pattern 140. For example, a side surface of the first solder resist 160 may directly contact a side surface of the second outer layer circuit pattern 140.

In this case, the height of the first solder resist 160 may be smaller than that of the second outer layer circuit pattern 140. Preferably, the upper surface of the first solder resist 160 may be positioned lower than the upper surface of the second outer layer circuit pattern 140. Accordingly, a portion of the side surface of the second outer layer circuit pattern 140 may be in contact with the first solder resist 160, and the remaining portion may be exposed.

In this case, the first solder resist 160 may be disposed to have the same height in the first region R1 and the second region R2. That is, the first solder resist 160 may include a first portion disposed in the first region R1 and a second portion disposed in the second region R2. In addition, the first portion of the first solder resist 160 and the second portion of the first solder resist 160 may have substantially the same height.

Here, the first solder resist 160 is disposed to primarily surround the second outer layer circuit pattern 140, and accordingly, it is possible to inhibit the second outer layer circuit pattern 140 from collapsing or rubbing.

The first solder resist 160 may use a photo solder resist film. The first solder resist 160 may have a structure in which a resin and a filler are mixed.

In the embodiment, as described above, the first solder resist 160 surrounds the second outer layer circuit pattern 140 on the primer layer 150 and is in direct contact with the side surface of the second outer layer circuit pattern 140 and is preferentially disposed. And, the second outer layer circuit pattern 140 of the fine circuit pattern in the embodiment can be supported by the first solder resist 160. Preferably, in the embodiment, the second outer layer circuit pattern 140 disposed in the first region R1 is primarily supported by the first solder resist 160, and accordingly, it is possible to stably protect the second outer layer circuit pattern 140 from external impact.

Meanwhile, a second solder resist 170 may be disposed on the first solder resist 160. Like the first solder resist 160, the second solder resist 170 may be embodied as a photo solder resist film. The second solder resist 170 may also have a structure in which a resin and a filler are mixed.

However, in an embodiment, a material properties of the first solder resist 160 may be different from a material properties of the second solder resist 170. Here, the material properties may include a coefficient of thermal expansion (CTE) and a filler content.

In addition, a coefficient of thermal expansion of the first solder resist 160 may be different from a coefficient of thermal expansion of the second solder resist 170. Also, a filler content of the first solder resist 160 may be different from a filler content of the second solder resist 170.

The second solder resist 170 may be disposed on the first solder resist 160 to secondarily protect the second outer layer circuit pattern 140 in the first region R1.

In this case, the second solder resist 170 may have different heights for each region.

That is, the second solder resist 170 may include a first portion disposed in the first region R1 and a second portion disposed in the second region R2.

In addition, the first portion of the second solder resist 170 may have a first height. In addition, the second portion of the second solder resist 170 may have a second height greater than the first height.

Accordingly, an upper surface of the first portion of the second solder resist 170 may be positioned lower than an upper surface of the second outer layer circuit pattern 140. Preferably, the first portion of the second solder resist 170 may be formed to expose a portion of a side surface and an upper surface of the second outer layer circuit pattern 140.

Also, an upper surface of the second portion of the second solder resist 170 may be positioned higher than an upper surface of the second outer layer circuit pattern 140. Preferably, the second portion of the second solder resist 170 may have a structure protruding above the upper surface of the second outer layer circuit pattern 140. Accordingly, the second outer layer circuit pattern 140 disposed in the second region R2 may be buried in the second portion of the second solder resist 170.

Here, the second solder resist 170 may have different heights for each region by selectively removing only the second portion of the second solder resist 170 disposed in the first region R1 as the second solder resist 170 is exposed and developed.

In this case, the first protective layer may include only the second solder resist 170 without including the first solder resist 160. For example, a support layer supporting the second outer layer circuit pattern 140 may be formed using only the second solder resist 170 by disposing the second solder resist on the primer layer 150 and selectively removing the second solder resist 170 for each region. However, when the support layer is formed with only one layer of solder resist, the following problems may occur depending on the material properties of the solder resist. For example, when the support layer is formed with only one layer of solder resist, a reliability problem occurs in that the circuit board is warped according to the thermal expansion coefficient of the solder resist. For example, when a support layer is formed with only one layer of solder resist, the second outer layer circuit pattern 140 may have a problem in that the filler remains on the surface of the second outer layer circuit pattern due to the filler content included in the solder resist, and accordingly, a reliability problem may occur.

The embodiment inhibits the occurrence of warpage and improves reliability according to a Coefficient of Thermal Expansion (CTE) relaxation by forming a support layer of a multilayer structure using a plurality of solder resists having different material properties as described above.

In this case, the coefficient of thermal expansion of the first solder resist 160 may be smaller than the coefficient of thermal expansion of the second solder resist 170. For example, the first solder resist 160 may have a thermal expansion coefficient of 10 to 25 ppm (@alpha 1). For example, the second solder resist 170 may have a coefficient of thermal expansion of 30 to 50 ppm (@alpha 1). That is, the embodiment allows to minimize the occurrence of warpage of the circuit board due to CTE relaxation by arranging the first solder resist 160 having a low coefficient of thermal expansion preferentially on the primer layer 150, and arranging the second solder resist 170 having a high coefficient of thermal expansion on the first solder resist 160.

Meanwhile, the filler content in the first solder resist 160 may be different from the filler content in the second solder resist 170. Preferably, the filler content in the first solder resist 160 may be higher than the filler content in the second solder resist 170.

That is, the upper surface of the second solder resist 170 is positioned adjacent to the upper surface of the second outer layer circuit pattern 140, and accordingly, a portion of the filler included in the second solder resist 170 may remain on the upper surface of the second outer layer circuit pattern 140. Therefore, the filler content in the second solder resist 170 is lower than that of the first solder resist 160 to inhibit this.

In addition, the filler content in the first solder resist 160 is relatively higher than that of the second solder resist 170. In this case, the upper surface of the first solder resist 160 is spaced apart from the upper surface of the second outer layer circuit pattern 140 by a predetermined interval. Accordingly, the filler included in the first solder resist 160 does not remain on the second outer layer circuit pattern 140 in the process of forming the first solder resist 160.

For example, a SiO2 filler may be included in the first solder resist 160, and the content thereof may be 50 wt % to 65 wt %.

In addition, the second solder resist 170 may include a filler such as BaSO4, SiO2, Talc, and the like, and the content thereof may be 20 wt % to 35 wt %.

As described above, in the embodiment, a protective layer capable of covering the second outer layer circuit pattern 140 of the second region R2 is formed while supporting the second outer layer circuit pattern 140 of the first region R1 using the first solder resist 160 and the second solder resist 170 having different material properties.

Meanwhile, the second outer layer circuit pattern 140 may include a trace 141 and a pad 142 according to functions. The pad 142 may be a region in which an adhesive member (not shown) is disposed for connection with an electronic component such as a chip. In addition, the trace 141 may be a wiring line connecting different pads. Here, the pad 142 generally has a width greater than that of the trace, and thus the pad 142 may have a characteristic strong against external impact. However, the trace 141 are disposed to have a width and an interval corresponding to the fine circuit pattern as described above, and thus may have a weak characteristic against external impact. Accordingly, the first solder resist 160 and the second solder resist 170 may serve to stably support the second outer layer circuit pattern 140 disposed in the first region R1, more specifically, the trace 141 the second outer layer circuit pattern 140 in the first region R1.

Meanwhile, as shown in FIG. 4, the second outer layer circuit pattern 140 may have a first height H1 and may be disposed on the primer layer 150.

In addition, the first solder resist 160 may have a second height H2 and be disposed on the primer layer 150.

In this case, the first height H1 is greater than the second height H2. Preferably, the first solder resist 160 may be disposed between the plurality of second outer layer circuit patterns 140 in contact with the side surfaces of the second outer layer circuit patterns 140 while having a height smaller than that of the second outer layer circuit pattern 140. In this case, the second height H2 may be 30% to 50% of the first height H1. For example, when the second height H2 is less than 30% of the first height H1, the second outer layer circuit pattern 140 may not be stably supported by the first solder resist 160. For example, when the second height H2 is less than 30% of the first height H1, there may be difficulties in the process of forming the first solder resist 160. For example, when the second height H2 is greater than 50% of the first height H1, a portion of the filler included in the first solder resist 160 may remain on the second outer layer circuit pattern 140. For example, when the second height H2 is greater than 50% of the first height H1, there may be difficulties in the process of forming the second solder resist 170.

Meanwhile, the second solder resist 170 may be disposed on the first solder resist 160 to have different heights for each region.

The second solder resist 170 may include a first portion disposed in the first region R1 and a second portion disposed in the second region R2.

In this case, the first portion of the second solder resist 170 may have a third height H3 and be disposed on the first solder resist 160. In addition, a second portion of the second solder resist 170 may have a fourth height H4 and be disposed on the first solder resist 160.

In this case, the third height H3 is greater than the first height H1 and the second height H2. Preferably, the first portion of the second solder resist 170 may be disposed on the first solder resist 160 while having a height smaller than that of the second outer layer circuit pattern 140. In this case, the third height H3 may be 70% to 90% of the first height H1. For example, when the third height H3 is less than 70% of the first height H1, the second outer layer circuit pattern 140 may not be stably supported by the second solder resist 170. For example, when the third height H3 is less than 70% of the first height H1, there may be difficulties in the process of forming the second solder resist 160. For example, when the third height H3 is greater than 90% of the first height H1, a portion of the filler included in the second solder resist 170 may remain on the second outer layer circuit pattern 140. For example, when the third height H3 is greater than 90% of the first height H1, a problem in that the surface of the second outer layer circuit pattern 140 is covered by the second solder resist 170 may occur due to the deviation in the process of forming the second solder resist 170.

Meanwhile, the fourth height H4 may be greater than the first height H1, the second height H2, and the third height H3. Preferably, the fourth height H4 may be 120% to 200% of the first height H1. For example, when the fourth height H4 is less than 120% of the first height H1, the surface of the second outer layer circuit pattern 140 of the second region R2 may not be stably protected by the second solder resist 170. For example, when the fourth height H4 is greater than 200% of the first height H1, the overall thickness of the circuit board may increase.

Figure 5:
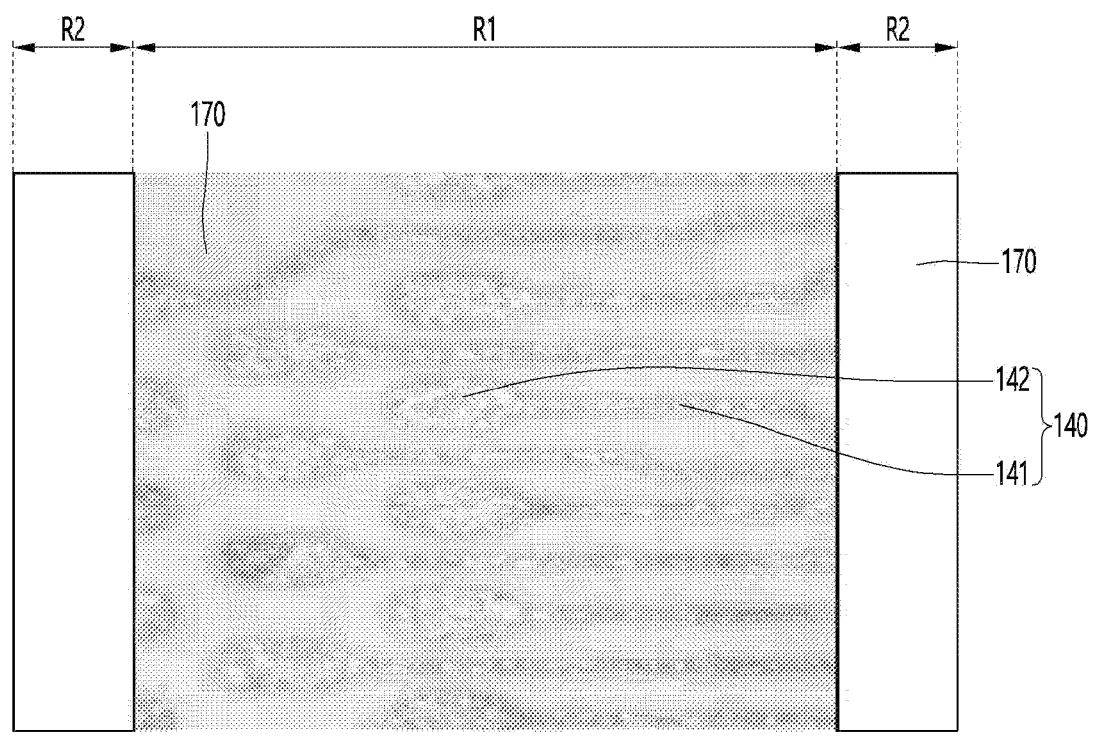
FIG. 5 is a view showing a circuit board including a protective layer according to an embodiment.

FIG. 5 is a view showing a circuit board including a protective layer according to an embodiment.

A protective layer including the first solder resist 160 and the second solder resist 170 according to the embodiment will be described with reference to FIG. 5. Here, the first solder resist 160 and the second solder resist 170 may be a protective layer protecting the surface of the second outer layer circuit pattern 140 in the second region R2, or may be a support layer supporting the second outer layer circuit pattern 140 in the first region R1.

At this time, the circuit pattern in the comparative example is disposed on the insulating layer having a protruding structure. In addition, the circuit pattern may be independently disposed on the insulating layer without being supported by another supporting layer. The circuit pattern in the region corresponding to the fine pattern of the comparative example is collapsed or abraded.

This may occur in the circuit pattern of the outermost layer in the circuit board including the circuit pattern manufactured by the SAP method.

Alternatively, in the embodiment, the primer layer 150 is disposed on the eighth insulating layer 118, and the second outer layer circuit pattern 140 is disposed on the primer layer 150.

Further, the first solder resist 160 and the second solder resist 170 are disposed on the primer layer 150 in order to function as a support layer and a protective layer disposed around the second outer layer circuit pattern 140.

In this case, the first solder resist 160 and the second solder resist 170 may be disposed in the first region R1 and the second region R2, respectively.

In this case, the first solder resist 160 and the second solder resist 170 may support the second outer layer circuit pattern 140 disposed on the outermost layer of the circuit board 100, in particular the trace 141 and the pad 142 of the second outer layer circuit pattern 140 disposed in the first region R1, and through this, the second outer layer circuit pattern 140 may be protected from external impact.

Figure 6A:
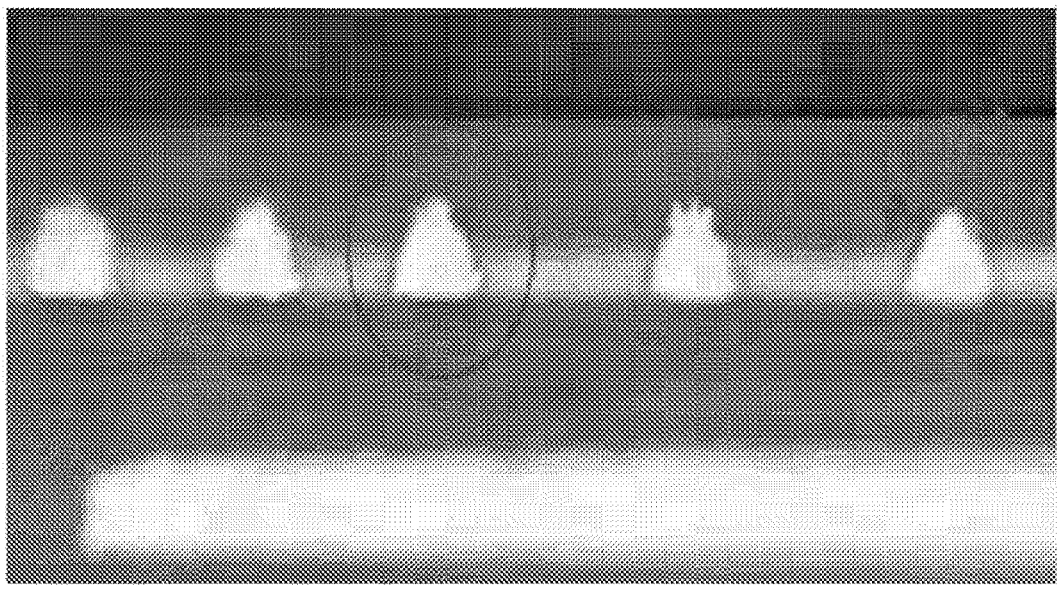
FIG. 6A is a view showing an outer layer circuit pattern according to a comparative example.
Figure 6B:
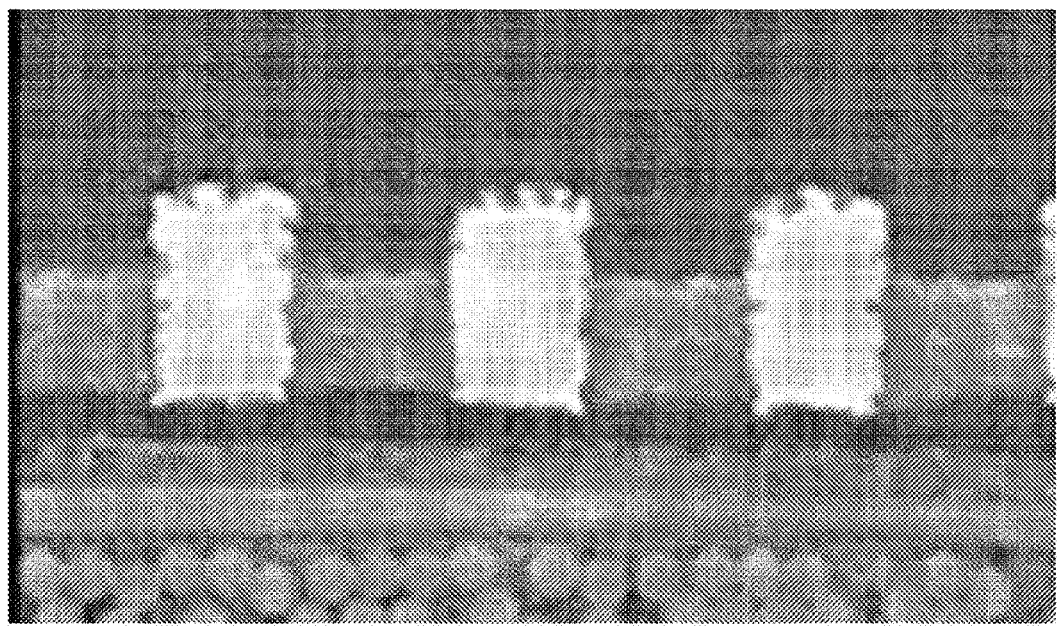
FIG. 6B is a view showing a second outer layer circuit pattern according to an embodiment.
Figure 6C:
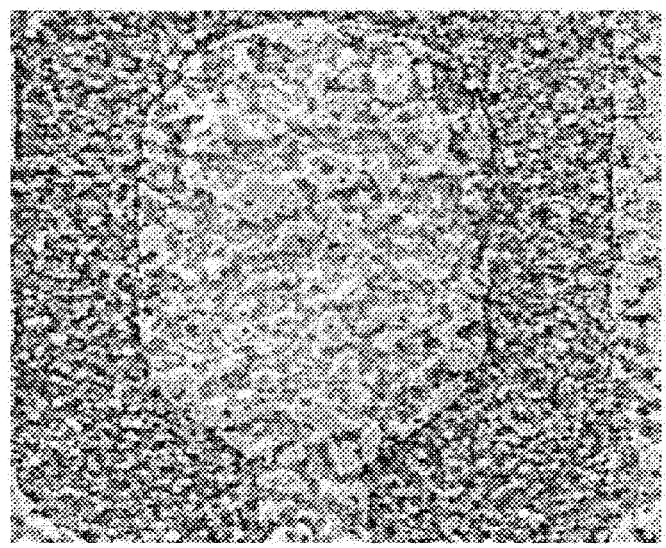
FIG. 6C is a view showing surfaces of first and second solder resists according to an embodiment.
Figure 6C:
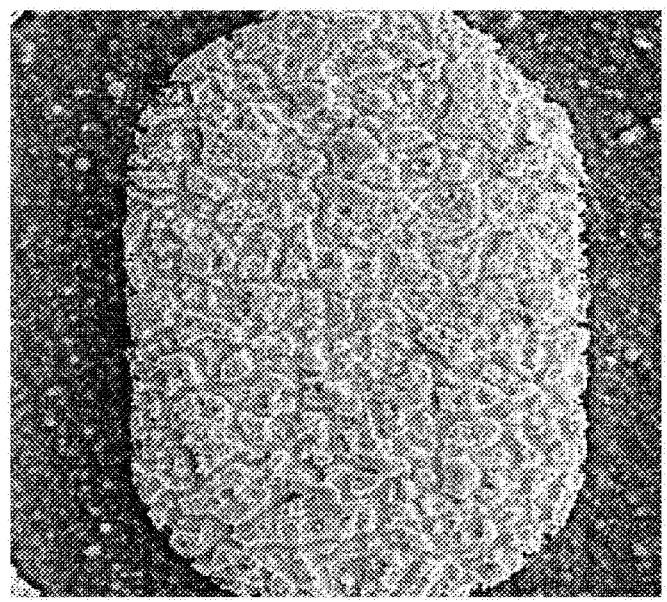

FIG. 6A is a view showing an outer layer circuit pattern according to a comparative example, FIG. 6B is a view showing a second outer layer circuit pattern according to an embodiment, and FIG. 6C is a view showing surfaces of first and second solder resists according to an embodiment.

Meanwhile, in forming the protective layer, various methods may be used to remove a portion of the protective layer in the first region R1. For example, a portion of the protective layer may be removed by a physical method or a chemical method. For example, the protective layer may be removed by a method such as plasma or sand blasting.

However, as shown in FIG. 6A, when the protective layer is physically or chemically removed, the circuit pattern is also removed during the process of removing the protective layer, so that the circuit pattern is deformed. For example, the circuit pattern may have a triangular cross-section as a part of the circuit pattern is removed together in the process of removing the protective layer. In addition, when the upper portion of the circuit pattern has a triangular shape, an adhesive member such as a solder ball cannot be stably seated on the circuit pattern, and thus a reliability problem may occur. In addition, expensive equipment is required in order to remove the protective layer by the physical or chemical method, and thus manufacturing cost may increase.

On the other hand, in the embodiment as shown in FIG. 6B, the first solder resist 160 and the second solder resist 170 may be removed to have a desired height by using an exposure and development process to remove the first solder resist 160 and the second solder resist 170. In addition, deformation of the second outer layer circuit pattern 140 does not occur during the exposure and development process, and the cross-sectional shape of the second outer layer circuit pattern 140 may maintain a rectangular shape.

Also, referring to FIG. 6C, the first solder resist 160 and the second solder resist 170 have different material properties. In this case, the material properties include the content of the filler.

At this time, it can be seen that there is a large difference between the filler content included in the first solder resist 160 and the filler content included in the second solder resist 170 as shown in (a) of FIG. 6C. In addition, in the embodiment, the thermal expansion coefficient can be compensated by combining two materials for buffering the thermal expansion coefficient to form the first solder resist 160 and the second solder resist 170, and accordingly, it is possible to inhibit the occurrence of warpage of the circuit board.

Furthermore, the first solder resist 160 may have Dk 3.3, Df 0.01 @ 1 GHz, and the second solder resist 170 may have Dk 3.5, Df 0.015 @ 1 GHz, accordingly, since the dielectric constant can be lowered, the dielectric constant due to the branching effect can be improved.

FIGS. 7 to 16 are views showing the manufacturing method of the circuit board shown in FIG. 2 in order of process.

Figure 7:
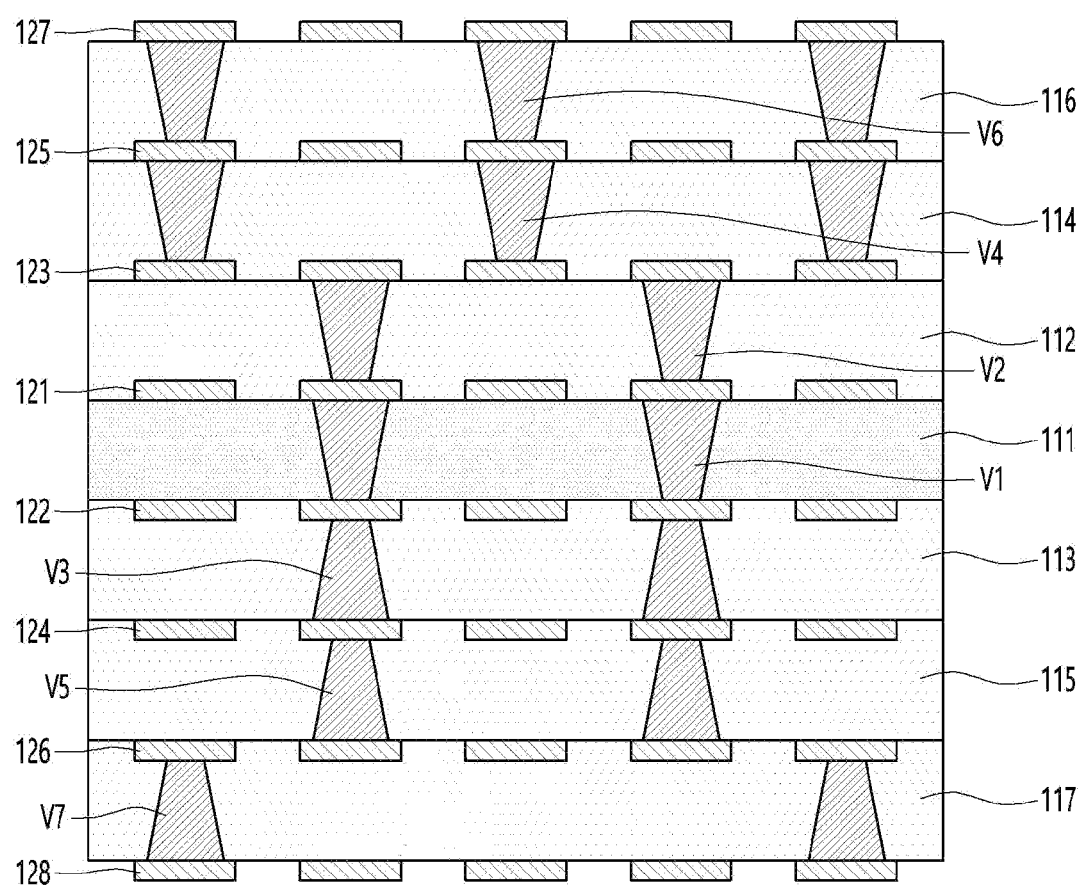
FIGS. 7 to 16 are views showing the manufacturing method of the circuit board shown in FIG. 2 in order of process.

Referring to FIG. 7, the embodiment may preferentially proceed with a process of manufacturing an inner layer substrate 100-1 for manufacturing an inner portion of the circuit board 100.

A process for manufacturing the inner layer substrate 100-1 will be briefly described.

The inner layer substrate 100-1 may include one insulating layer or, alternatively, a plurality of insulating layers.

In FIG. 7, the inner-layer substrate 100-1 is illustrated as having a seven-layer insulating layer structure, but is not limited thereto. For example, the inner-layer substrate 100-1 may include fewer than seven insulating layers, or alternatively, more than seven insulating layers.

The inner layer substrate 100-1 may include the remaining insulating layers other than the insulating layer disposed on the outermost layer of the circuit board 100. For example, the inner layer substrate 100-1 may include an insulating layer disposed on the uppermost portion of the circuit board 100 and other insulating layers excluding the insulating layer disposed on the lowermost portion of the circuit board 100.

Briefly describing the process of manufacturing the inner layer substrate 100-1, the first insulating layer 111 is firstly prepared.

And, when the first insulating layer 111 is prepared, a first via (V1) is formed in the first insulating layer (111), and a first circuit pattern 121 and a second circuit pattern 122 are respectively formed on the upper and lower surfaces of the first insulating layer 111.

Thereafter, a second insulating layer 112 is formed on the first insulating layer 111, and a third insulating layer 113 is formed under the first insulating layer 111.

Next, a second via V2 is formed in the second insulating layer 112, and a third circuit pattern 123 is formed on the upper surface of the second insulating layer 112. In addition, a third via V3 is formed in the third insulating layer 113, and a fourth circuit pattern 124 is formed under the lower surface of the third insulating layer 113.

Thereafter, a fourth insulating layer 114 is formed on the second insulating layer 112, and a fifth insulating layer 115 is formed under the third insulating layer 113.

Next, a fourth via V4 is formed in the fourth insulating layer 114, and a fifth circuit pattern 125 is formed on the upper surface of the fourth insulating layer 114. In addition, a fifth via V5 is formed in the fifth insulating layer 115, and a sixth circuit pattern 126 is formed under the lower surface of the fifth insulating layer 115.

Thereafter, a sixth insulating layer 116 is formed on the fourth insulating layer 114, and a seventh insulating layer 117 is formed under the fifth insulating layer 115.

Next, a sixth via V6 is formed in the sixth insulating layer 116, and a seventh circuit pattern 127 is formed on the upper surface of the sixth insulating layer 116. In addition, a seventh via V7 is formed in the seventh insulating layer 117, and an eighth circuit pattern 128 is formed under the lower surface of the seventh insulating layer 117.

Since the process of manufacturing the inner layer substrate 100-1 is a known technique in the art to which the present invention pertains, a detailed description thereof will be omitted.

Figure 8:
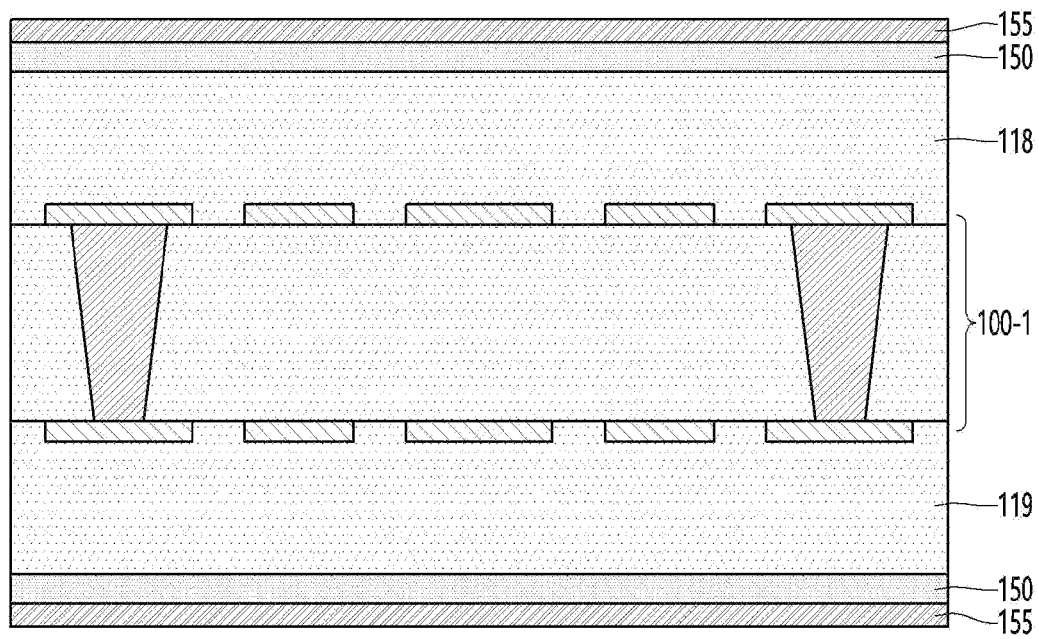

Referring to FIG. 8, when the inner layer substrate 100-1 is manufactured, an eighth insulating layer 118 corresponding to the first outermost insulating layer is formed on the upper surface of the inner layer substrate 100-1. In addition, a ninth insulating layer 119 corresponding to the second outermost insulating layer is formed under the lower surface of the inner layer substrate 100-1.

At this time, when the eighth insulating layer 118 and the ninth insulating layer 119 are laminated, a primer layer 150 is disposed on each of the upper surface of the eighth insulating layer 118 and the lower surface of the ninth insulating layer 119, and a metal layer 155 may be disposed on the primer layer 150. The metal layer 155 may serve to planarize the eighth insulating layer 118 and the ninth insulating layer 119 to have uniform heights. For example, the metal layer 155 may be disposed to improve the laminating reliability of the eighth insulating layer 118 and the ninth insulating layer 119.

The primer layer 150 may serve to increase bonding strength between each of the eighth insulating layer 118 and ninth insulating layer 119 and the first outer circuit pattern 130 and the second outer circuit pattern 140 to be disposed thereunder and thereon. That is, when the first outer circuit pattern 130 and the second outer circuit pattern 140 are disposed without the primer layer 150, since the bonding force between the eighth insulating layer 118 and the second outer layer circuit pattern 140 is low, they may be separated from each other.

Meanwhile, although FIG. 8 illustrates that the primer layer 150 is disposed on the upper surface of the eighth insulating layer 118 and the lower surface of the ninth insulating layer 119, respectively, the present invention is not limited thereto. For example, the primer layer 150 may be selectively disposed on the surface of the insulating layer on which the fine circuit pattern is to be disposed. That is, when only the first outer layer circuit pattern 130 is a fine circuit pattern, the primer layer 150 may be disposed only on the lower surface of the ninth insulating layer 119. In addition, when only the second outer layer circuit pattern 140 is a fine circuit pattern, the primer layer 150 may be disposed only on the upper surface of the eighth insulating layer 118. In addition, when the first outer circuit pattern 130 and the second outer circuit pattern 140 are both fine circuit patterns, the primer layer 150 may be disposed on both the upper surface of the eighth insulating layer 118 and the lower surface of the ninth insulating layer 119.

Figure 9:
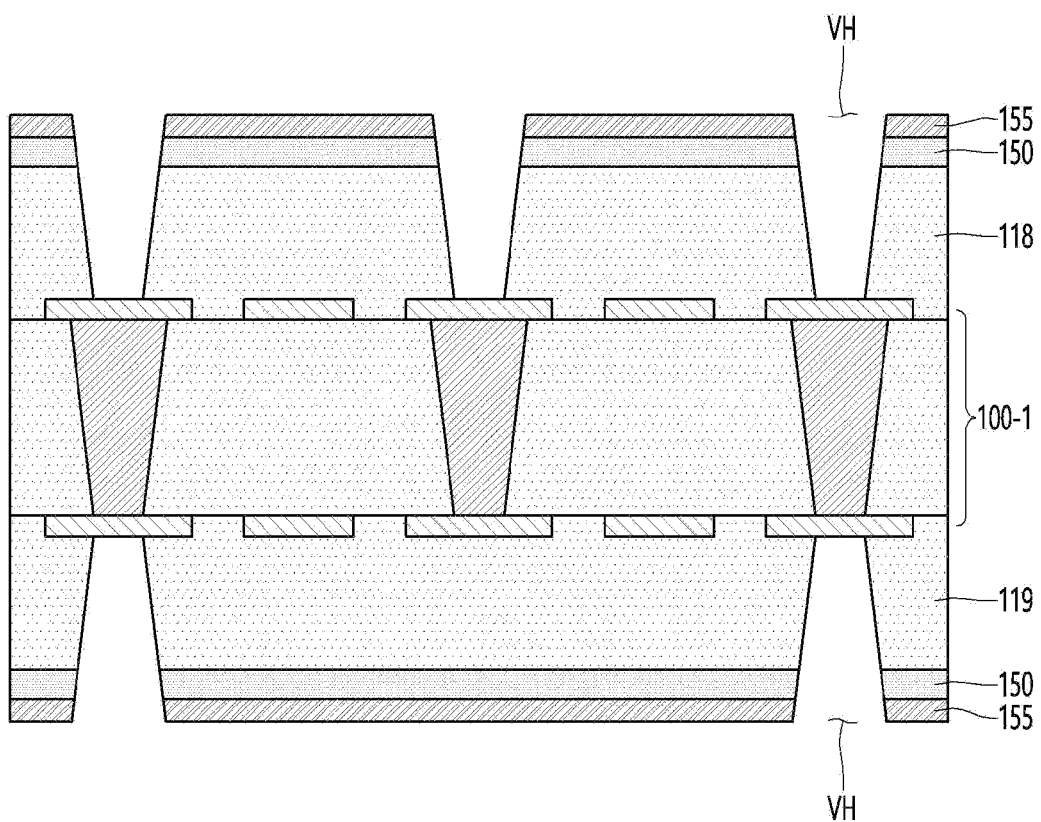

Referring to FIG. 9, when the eighth insulating layer 118 and the ninth insulating layer 119 are disposed, a via hole VH is formed in each of the eighth insulating layer 118 and the ninth insulating layer 119. In this case, the via hole VH may be formed not only in the eighth insulating layer 118 and the ninth insulating layer 119, but also in the primer layer 150 and the metal layer 155, respectively.

Figure 10:
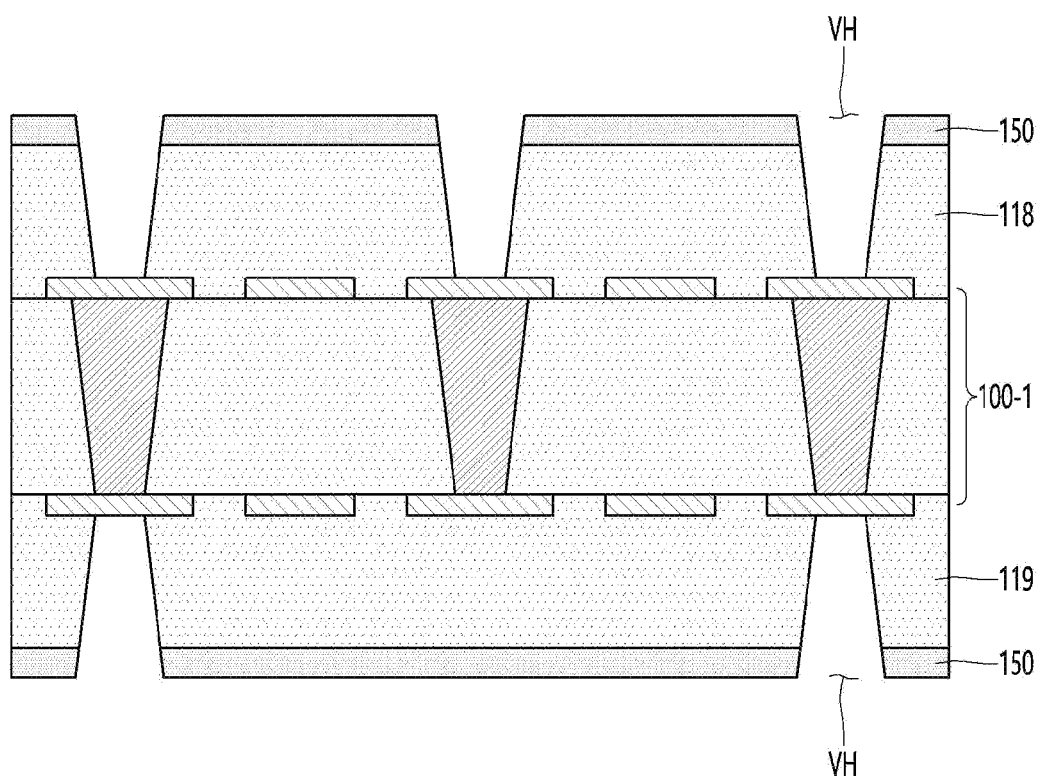

Next, referring to FIG. 10, when the via hole VH is formed, an etching process of removing the metal layer 155 disposed on the primer layer 150 may be performed. For example, a flash etching process may be performed to remove the metal layer 155 after the via hole VH is formed, and thus a process for exposing the surface of the primer layer 150 may be performed.

Figure 11:
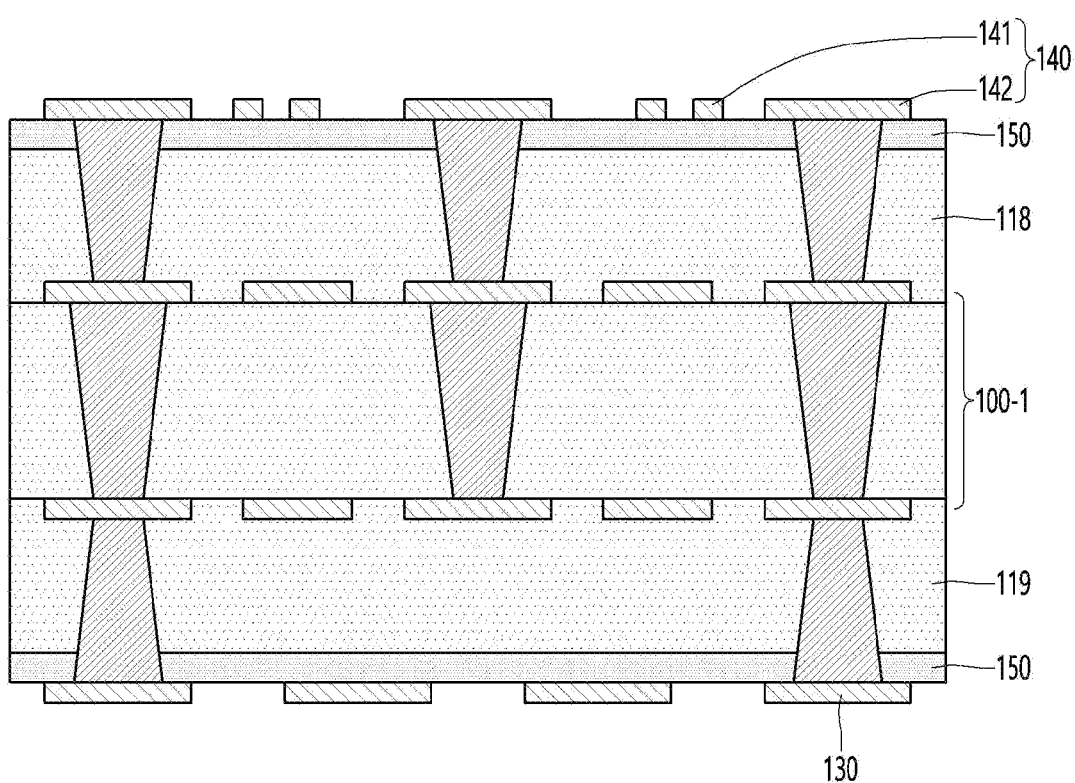

Next, referring to FIG. 11, a via (V) forming process for filling the via hole (VH) may be performed. Accordingly, the second outer layer circuit pattern 140 is formed on the upper surface of the eighth insulating layer 118, the first outer layer circuit pattern 130 may be formed on the lower surface of the ninth insulating layer 119. In this case, in the embodiment, the first outer layer circuit pattern 130 is illustrated as a general circuit pattern rather than a fine circuit pattern. However, the present invention is not limited thereto, and the first outer layer circuit pattern 130 together with the second outer layer circuit pattern may be a fine circuit pattern. Accordingly, when the first outer circuit pattern 130 is a general circuit pattern, the primer layer 150 between the ninth insulating layer 119 and the first outer circuit pattern 130 may be omitted.

A second outer layer circuit pattern 140 is disposed on the upper surface of the eighth insulating layer 118. In this case, the second outer layer circuit pattern 140 disposed on the upper surface of the eighth insulating layer 118 may include a portion disposed in the open region R1 of the first protective layer 170 and a portion disposed in the arrangement region R2 of the first passivation layer 170. In addition, each of the above portions may include a trace 141 which is a wiring line for signal transmission and a pad 142 corresponding to an end of the trace 141 and to which a component is to be attached.

Figure 12:
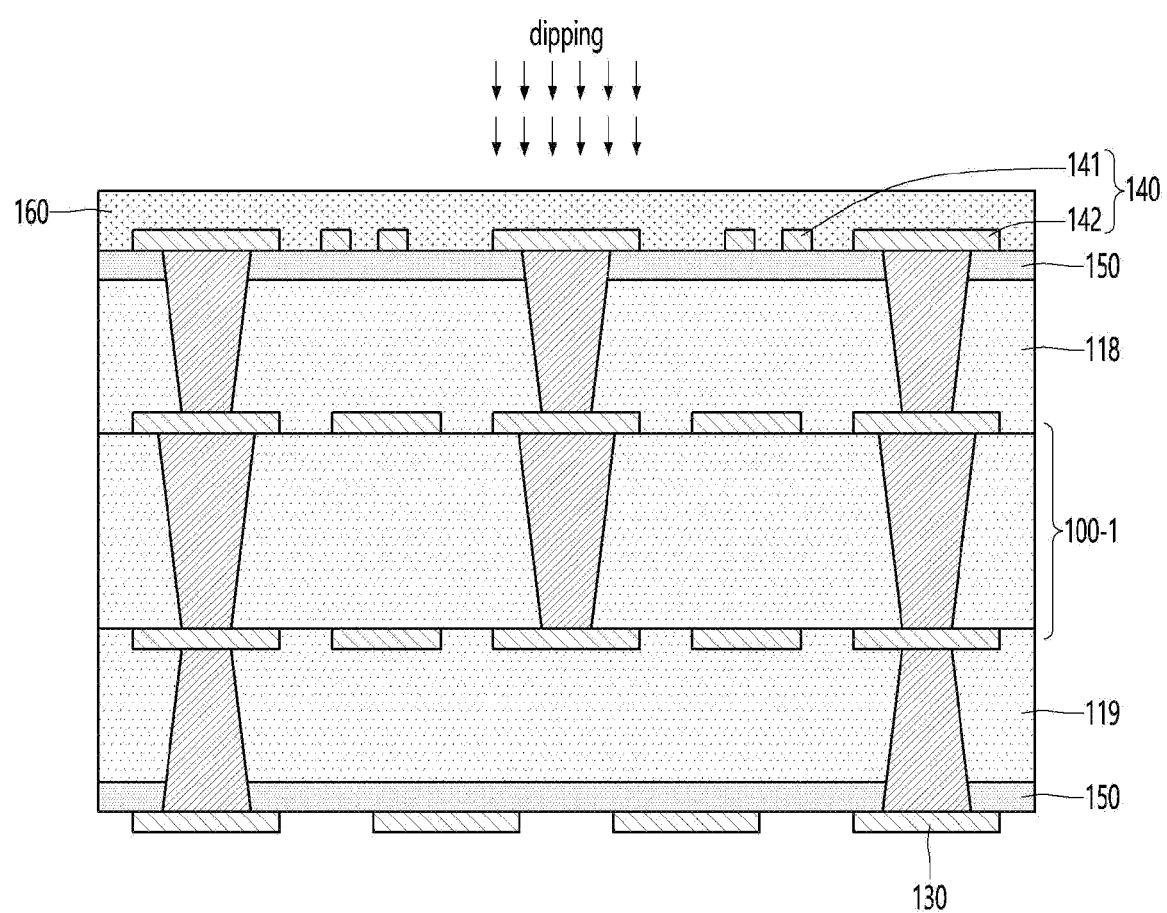

Next, referring to FIG. 12, a first solder resist 160 is disposed on the primer layer 150 to cover the second outer layer circuit pattern 140. The first solder resist 160 formed at this time may be disposed in both the first region R1 and the second region R2, and may be formed to have a greater height than the second outer layer circuit pattern 140.

When the first solder resist 160 is formed, the first solder resist 160 is exposed and developed, the first solder resist 160 may have a lower height than the second outer layer circuit pattern 140 by exposing and developing the first solder resist 160.

To this end, UV exposure is performed by masking only a desired region on the first solder resist 160, and thereafter, a process of adjusting the height of the first solder resist 160 in the unexposed region may be performed by dipping in an organic alkaline compound containing tetramethylammonium hydroxide (TMAH) or trimethyl-2-hydroxyethylammonium hydroxide (choline).

Figure 13:
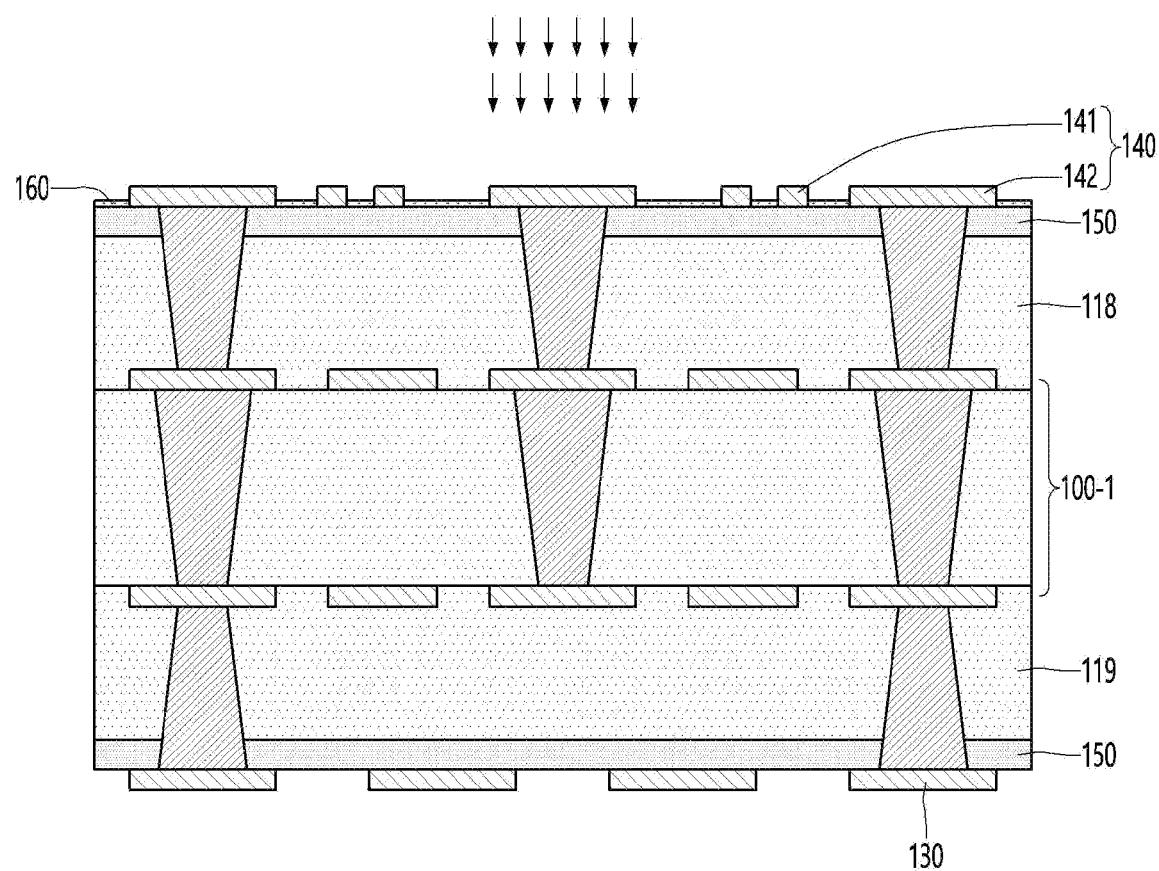

And, referring to FIG. 13, as the above process is performed, the first solder resist 160 may be formed to have a height lower than that of the second outer layer circuit pattern 140.

The first solder resist 160 may have a second height H2 and be disposed on the primer layer 150.

In this case, the first height H1 is greater than the second height H2. Preferably, the first solder resist 160 may be disposed between the plurality of second outer layer circuit patterns 140 in contact with the side surfaces of the second outer layer circuit patterns 140 while having a height smaller than that of the second outer layer circuit pattern 140. In this case, the second height H2 may be 30% to 50%/o of the first height H1. For example, when the second height H2 is less than 30% of the first height H1, the second outer layer circuit pattern 140 may not be stably supported by the first solder resist 160. For example, when the second height H2 is less than 30% of the first height H1, there may be difficulties in the process of forming the first solder resist 160. For example, when the second height H2 is greater than 50% of the first height H1, a portion of the filler included in the first solder resist 160 may remain in the second outer layer circuit pattern 140. For example, when the second height H2 is greater than 50% of the first height H1, there may be difficulties in the process of forming the second solder resist 170.

Figure 14:
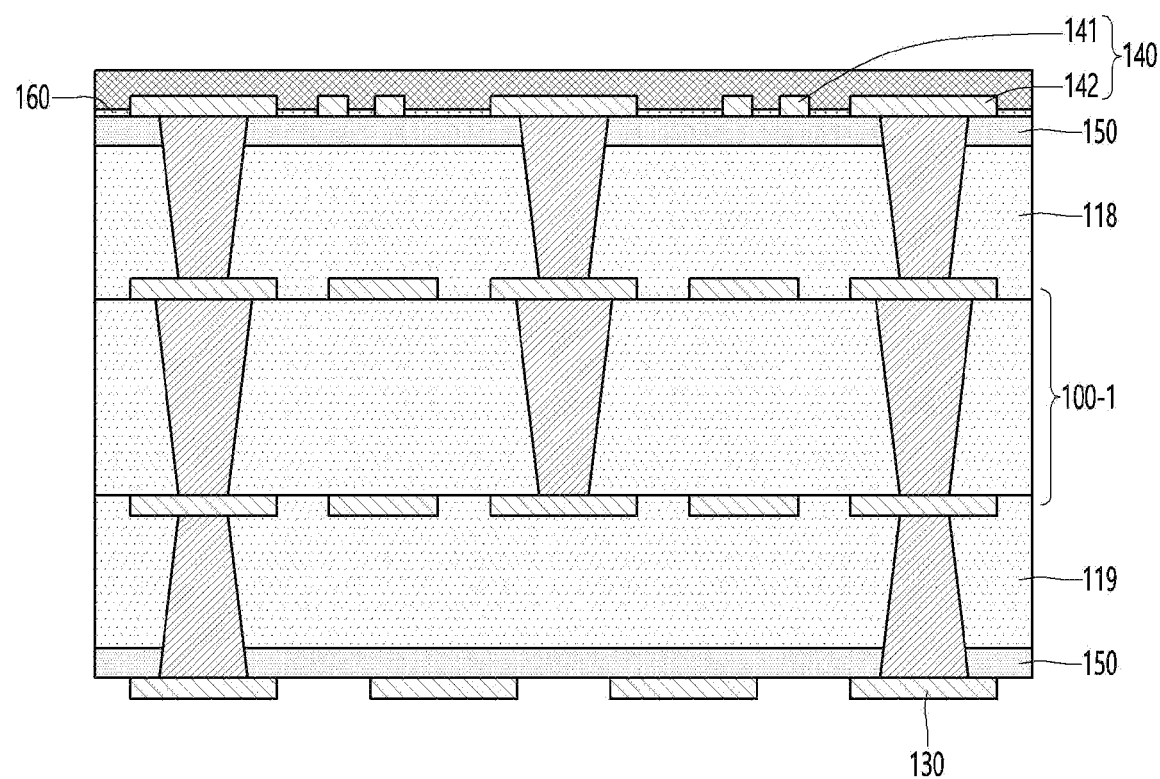

Next, as shown in FIG. 14, a second solder resist 170 is disposed on the first solder resist 160. In this case, the second solder resist 170 may be disposed to have a height greater than that of the second outer layer circuit pattern 140 in both the first region R1 and the second region R2.

Figure 15:
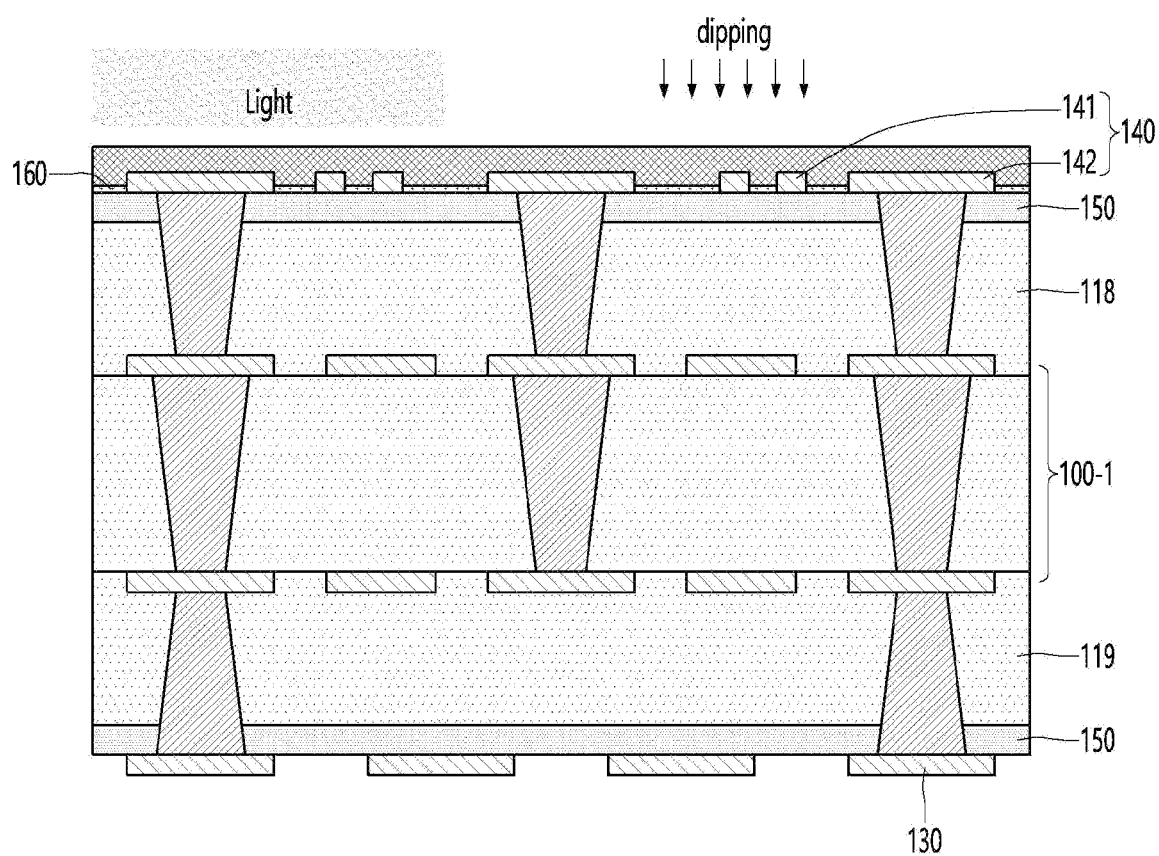

Thereafter, as shown in FIG. 15, UV exposure is performed by masking only a desired region on the second solder resist 170, and thereafter, a process of adjusting the height of the second solder resist 170 in the unexposed region may be performed by dipping in an organic alkaline compound containing tetramethylammonium hydroxide (TMAH) or trimethyl-2-hydroxyethylammonium hydroxide (choline).

In other words, a process of removing a partial region of the second solder resist 170 may be performed by performing the exposure and development process with respect to the second solder resist 170 so that the height in the first region R1 and the height in the second region R2 are different from each other.

Figure 16:
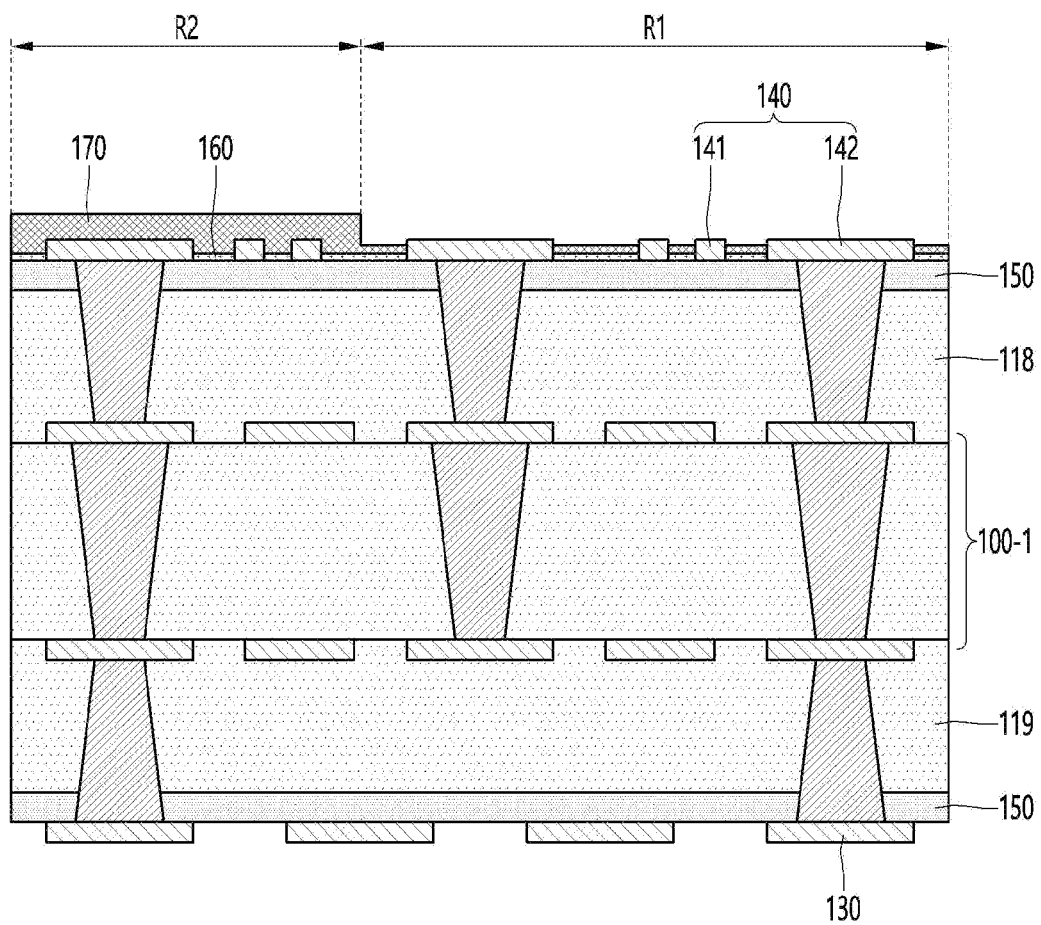

Next, as in FIG. 16, the second solder resist 170 includes a first portion disposed in the first region R1 and a second portion disposed in the second region R2 and having a different height from the first portion by performing an exposure and development process of the second solder resist 170.

That is, through the above process, the second solder resist 170 may be disposed on the first solder resist 160 to have different heights for each region.

The second solder resist 170 may include a first portion disposed in the first region R1 and a second portion disposed in the second region R2.

In this case, the first portion of the second solder resist 170 may have a third height H3 and be disposed on the first solder resist 160. In addition, a second portion of the second solder resist 170 may have a fourth height H4 and be disposed on the first solder resist 160.

In this case, the third height H3 is greater than the first height H1 and the second height H2. Preferably, the first portion of the second solder resist 170 may be disposed on the first solder resist 160 while having a height smaller than that of the second outer layer circuit pattern 140. In this case, the third height H3 may be 70% to 90% of the first height H1. For example, when the third height H3 is less than 70% of the first height H1, the second outer layer circuit pattern 140 may not be stably supported by the second solder resist 170. For example, when the third height H3 is less than 70% of the first height H1, there may be difficulties in the process of forming the second solder resist 160. For example, when the third height H3 is greater than 90% of the first height H1, a portion of the filler included in the second solder resist 170 may remain on the second outer layer circuit pattern 140. For example, when the third height H3 is greater than 90% of the first height H1, a problem in that the surface of the second outer layer circuit pattern 140 is covered by the second solder resist 170 may occur due to the deviation in the process of forming the second solder resist 170.

Meanwhile, the fourth height H4 may be greater than the first height H1, the second height H2, and the third height H3. Preferably, the fourth height H4 may be 120% to 200% of the first height H1. For example, when the fourth height H4 is less than 120% of the first height H1, the surface of the second outer layer circuit pattern 140 of the second region R2 may not be stably protected by the second solder resist 170. For example, when the fourth height H4 is greater than 200% of the first height H1, the overall thickness of the circuit board may increase.

The coefficient of thermal expansion of the first solder resist 160 may be smaller than the coefficient of thermal expansion of the second solder resist 170. For example, the first solder resist 160 may have a thermal expansion coefficient of 10 to 25 ppm (@alpha 1). For example, the second solder resist 170 may have a coefficient of thermal expansion of 30 to 50 ppm (@alpha 1). That is, the embodiment allows to minimize the occurrence of warpage of the circuit board due to CTE relaxation by arranging the first solder resist 160 having a low coefficient of thermal expansion preferentially on the primer layer 150, and arranging the second solder resist 170 having a high coefficient of thermal expansion on the first solder resist 160.

Meanwhile, the filler content in the first solder resist 160 may be different from the filler content in the second solder resist 170. Preferably, the filler content in the first solder resist 160 may be higher than the filler content in the second solder resist 170.

That is, the upper surface of the second solder resist 170 is positioned adjacent to the upper surface of the second outer layer circuit pattern 140, and accordingly, a portion of the filler included in the second solder resist 170 may remain on the upper surface of the second outer layer circuit pattern 140. Therefore, the filler content in the second solder resist 170 is lower than that of the first solder resist 160 to inhibit this.

In addition, the filler content in the first solder resist 160 is relatively higher than that of the second solder resist 170. In this case, the upper surface of the first solder resist 160 is spaced apart from the upper surface of the second outer layer circuit pattern 140 by a predetermined interval. Accordingly, the filler included in the first solder resist 160 does not remain on the second outer layer circuit pattern 140 in the process of forming the first solder resist 160.

For example, a SiO2 filler may be included in the first solder resist 160, and the content thereof may be 50 wt % to 65 wt %.

In addition, the second solder resist 170 may include a filler such as BaSO4, SiO2, Talc, and the like, and the content thereof may be 20 wt % to 35 wt %.

In the above embodiment, a situation in which the filler remains on the surface of the second outer layer circuit pattern 140 is inhibited in advance by adjusting the filler content included in the second solder resist 170 in the embodiment as described above, and accordingly, the reliability of the circuit board is improved.

The circuit board in this embodiment is a circuit board having a multilayer structure of 8 or more layers, and includes an outer layer circuit pattern disposed on an uppermost outer insulating layer of the multilayers and protruding from the surface of the outer insulating layer. In this case, the outer layer circuit pattern includes a second-first circuit pattern disposed in a second region in which a solder resist (SR) is disposed among an upper region of the outer insulating layer, and a second-second circuit pattern disposed in a first region that is an open region where the solder resist is not disposed. In this case, the second-first circuit pattern may be supported by being surrounded by the solder resist, but since the second-second circuit pattern does not have a support layer capable of supporting the second-first circuit pattern, it may easily collapse due to various factors.

Accordingly, a support layer capable of supporting the second-second circuit pattern in the embodiment is formed on the first insulating layer corresponding to the outer insulating layer. In this case, the support layer in the embodiment may be implemented with a solder resist having a multilayer structure. Preferably, the multilayer solder resist of the embodiment is disposed between a plurality of second-second circuit patterns while covering the second-first circuit pattern and exposing the second-second circuit pattern.

Accordingly, the embodiment can solve problems such as collapsing or abrasion of the protruded outer layer circuit pattern by miniaturization of the outer layer circuit pattern, and thus product reliability can be improved. In particular, the embodiment can solve problems such as collapsing or rubbing of the outer layer circuit pattern in the first region, thereby improving product reliability.

In this case, the solder resist of the embodiment may include a first solder resist and a second solder resist. In addition, the first solder resist may be disposed in the first region and the second region to have a height lower than that of the second-second circuit pattern. Preferably, an upper surface of the first solder resist may be positioned lower than an upper surface of the second circuit pattern in the first region and the second region. In addition, the second solder resist is disposed on the first solder resist, and thus may have different heights for each region. That is, an upper surface of the second solder resist in the first region is disposed to have a lower height than upper surfaces of the second-first and second-second circuit patterns, and an upper surface of the second solder resist in the second region may be disposed to have a higher height than upper surfaces of the second-first and second-second circuit patterns. In this case, the first solder resist and the second solder resist may have different material properties. Preferably, the first solder resist may include a material having a high filler content while having a lower CTE compared to the second solder resist.

Accordingly, the embodiment can minimize the occurrence of warpage of the circuit board by allowing the function of alleviating CTE in the laminated structure of the circuit board by applying first and second solder resists with different CTEs. In addition, the embodiment can inhibit in advance a situation in which the filler remains on the surface of the second-second circuit pattern by the second solder resist having a lower filler content than the first solder resist, and thus reliability can be improved.

In addition, when removing the first and second solder resists of the embodiment, they are removed using an exposure and development method rather than a sand blast or plasma method. At this time, when removing the solder resist using a sandblasting or plasma method, the outer layer circuit pattern may be deformed, and in some cases, a cross-section of the outer layer circuit pattern may have a triangular shape. And, when the cross section of the outer layer circuit pattern has a triangle, an adhesive member may not be stably disposed on the outer layer circuit pattern, and thus a reliability problem may occur. In contrast, the first and second solder resists in the embodiment may be removed without deformation of the outer layer circuit pattern, and thus reliability may be improved.

In addition, the circuit board of the embodiment can be applied to a 5G communication system, and thus, it is possible to further improve reliability by minimizing transmission loss at high frequencies. Specifically, the circuit board in the embodiment can be used at a high frequency and can reduce propagation loss.

The characteristics, structures and effects described in the embodiments above are included in at least one embodiment but are not limited to one embodiment. Furthermore, the characteristics, structures, effects, and the like illustrated in each of the embodiments may be combined or modified even with respect to other embodiments by those of ordinary skill in the art to which the embodiments pertain. Thus, it would be construed that contents related to such a combination and such a modification are included in the scope of the embodiments.

The above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the present invention defined in the appended claims.

The invention claimed is:

1. A circuit board comprising:
an insulating layer;
a circuit pattern disposed on the insulating layer; and
a protective layer disposed on the insulating layer;
wherein the protective layer includes:
a first layer disposed on the insulating layer; and
a second layer disposed on the first layer of the protective layer;
wherein an upper surface of the first layer is positioned lower than an upper surface of the circuit pattern and does not include a step portion, and
wherein an upper surface of the second layer includes a first portion and a second portion having different heights from each other.

2. The circuit board claim 1, wherein a thickness of the first layer of the protective layer is smaller than a thickness of the circuit pattern.

3. The circuit board claim 2, wherein a thickness of the first layer in a region that vertically overlaps with the first portion of the second layer is equal to a thickness of the first layer in a region that vertically overlaps with the second portion of the second layer.

4. The circuit board claim 1, wherein the circuit pattern includes:
a first electrode in contact with the first portion of the second layer; and
a second electrode in contact with the second portion of the second layer;
wherein the upper surface of the first layer is positioned lower than an upper surface of each of the first electrode and the second electrode.

5. The circuit board claim 4, wherein a width of the first electrode is smaller than a width of the second electrode.

6. The circuit board claim 5, wherein the upper surface of the first portion of the second layer is positioned lower than the upper surface of the second portion of the second layer.

7. The circuit board claim 6, wherein the upper surface of the first portion of the second layer is positioned lower than the upper surface of each of the first and second electrodes.

8. The circuit board claim 6, wherein the upper surface of the second portion of the second layer is positioned higher than the upper surface of each of the first and second electrodes.

9. The circuit board claim 7, wherein a sum of the thickness of the first layer and the thickness of the first portion of the second layer is less than a thickness of the first electrode.

10. The circuit board claim 4, wherein a side surface of the first electrode includes:
a first side surface contacting with the first layer of the protective layer;
a second side surface contacting with the first portion of the second layer of the protective layer; and
a third side surface not in contact with the protective layer.

11. The circuit board claim 8, wherein the second portion of the second layer of the protective layer entirely covers a side surface of the second electrode.

12. The circuit board claim 1, wherein the first and second layers of the protective layer include solder resist.

13. The circuit board claim 1, wherein a material properties of the first layer of the protective layer are different from a material properties of the second layer.

14. The circuit board claim 13, wherein a coefficient of thermal expansion of the first layer is smaller than a coefficient of thermal expansion of the second layer.

15. The circuit board claim 13, wherein each of the first layer and the second layer comprises a filler, and
wherein a filler content in the first layer is greater than a filler content in the second layer.

16. The circuit board claim 15, wherein the filler content in the first layer is 50 w % to 65 w %, and
wherein the filler content in the second layer is 20 w % to 35 w %.

17. The circuit board claim 2, wherein the thickness of the first layer of the protective layer satisfies 30% to 50% of the thickness of the circuit pattern.

18. The circuit board claim 7, wherein a height from a lower surface of the first layer of the protective layer to the upper surface of the first portion of the second layer satisfies 70% to 90% of a height from a lower surface of the first electrode to an upper surface of the first electrode.

19. The circuit board claim 1, wherein the insulating layer includes a plurality of insulating layers, and
wherein the circuit pattern is protruded on an upper surface of an uppermost insulating layer among the plurality of insulating layers.

20. The circuit board claim 1, comprising:
a primer layer disposed in a region between the upper surface of the insulating layer and the first layer of the protective layer, and in a region between the upper surface of the insulating layer and the circuit pattern; and
a via passing through the insulating layer and the primer layer.

* * * * *